(12) United States Patent
Yanagidaira et al.

(10) Patent No.: US 12,165,711 B2
(45) Date of Patent: Dec. 10, 2024

(54) SEMICONDUCTOR MEMORY DEVICE

(71) Applicant: Kioxia Corporation, Tokyo (JP)

(72) Inventors: Kosuke Yanagidaira, Fujisawa Kanagawa (JP); Hiroshi Tsubouchi, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 18/228,166

(22) Filed: Jul. 31, 2023

(65) Prior Publication Data

US 2023/0377662 A1    Nov. 23, 2023

Related U.S. Application Data

(63) Continuation of application No. 18/084,363, filed on Dec. 19, 2022, now Pat. No. 11,756,632, which is a
(Continued)

(30) Foreign Application Priority Data

Jul. 8, 2019 (JP) ................................ 2019-126990

(51) Int. Cl.
*G11C 16/26*      (2006.01)
*G11C 16/04*      (2006.01)
(Continued)

(52) U.S. Cl.
CPC .......... *G11C 16/26* (2013.01); *G11C 16/0483* (2013.01); *G11C 16/08* (2013.01);
(Continued)

(58) Field of Classification Search
CPC ..... G11C 16/26; G11C 16/0483; G11C 16/08; G11C 16/32; H10B 41/27; H10B 41/50; H10B 43/10; H10B 43/27; H10B 43/50
See application file for complete search history.

(56) References Cited

U.S. PATENT DOCUMENTS 7,986,573 B2   7/2011  Li
8,760,937 B2   6/2014  Honda
(Continued)

FOREIGN PATENT DOCUMENTS

JP   2019053796 A   4/2019
JP   2019053797 A   4/2019
(Continued)

OTHER PUBLICATIONS

Notice of Allowance dated May 2, 2023, issued in parent U.S. Appl. No. 18/084,363.
(Continued)

*Primary Examiner* — Son L Mai

(74) *Attorney, Agent, or Firm* — Holtz, Holtz & Volek PC

(57) ABSTRACT

A semiconductor memory device includes a memory cell connected between a bit line and a source line, a sense amplifier having a first transistor provided between at least two transistors of the sense amplifier and the bit line, and a controller which executes a read operation to read data stored by the memory cell. In the read operation, the controller applies a first voltage to the first transistor and a second voltage to the source line during a first time period, applies a third voltage to the first transistor and a fourth voltage to the source line during a second time period after the first time period, and applies the first voltage to the first transistor and a fifth voltage to the source line during a third time period after the second time period.

10 Claims, 22 Drawing Sheets

Related U.S. Application Data continuation of application No. 17/363,005, filed on Jun. 30, 2021, now Pat. No. 11,562,795, which is a continuation of application No. 16/774,630, filed on Jan. 28, 2020, now Pat. No. 11,081,188.

(51) Int. Cl.
  *G11C 16/08* (2006.01)
  *G11C 16/32* (2006.01)
  *H10B 43/10* (2023.01)
  *H10B 43/27* (2023.01)

(52) U.S. Cl.
  CPC ............. *G11C 16/32* (2013.01); *H10B 43/10* (2023.02); *H10B 43/27* (2023.02)

(56) References Cited

U.S. PATENT DOCUMENTS

| | | |
|---|---|---|
| 8,773,917 B2 | 7/2014 | Yuh |
| 9,520,164 B1 | 12/2016 | Yamamoto et al. |
| 9,859,011 B1 | 1/2018 | Konno et al. |
| 10,204,692 B1 | 2/2019 | Kamata et al. |
| 10,255,977 B2 | 4/2019 | Shimizu et al. |
| 10,297,326 B2 | 5/2019 | Kamata et al. |
| 10,515,703 B2 | 12/2019 | Yanagidaira |
| 10,573,386 B2 | 2/2020 | Kim et al. |
| 10,643,693 B2 | 5/2020 | Wang et al. |
| 10,658,039 B2 | 5/2020 | Iwai et al. |
| 10,964,377 B2 | 3/2021 | Kimura et al. |
| 11,049,571 B2 | 6/2021 | Yanagidaira |
| 11,756,632 B2 * | 9/2023 | Yanagidaira ........... G11C 16/32 365/185.21 |
| 2019/0080772 A1 | 3/2019 | Yanagidaira |
| 2020/0089630 A1 | 3/2020 | Yamamoto et al. |
| 2020/0194087 A1 | 6/2020 | Watanabe et al. |
| 2021/0065770 A1 | 3/2021 | Watanabe et al. |

FOREIGN PATENT DOCUMENTS

| | | |
|---|---|---|
| JP | 2020095768 | 6/2020 |
| JP | 2021034090 A | 3/2021 |

OTHER PUBLICATIONS

Notice of Allowance dated Sep. 20, 2022, issued in U.S. Appl. No. 17/363,005.

* cited by examiner

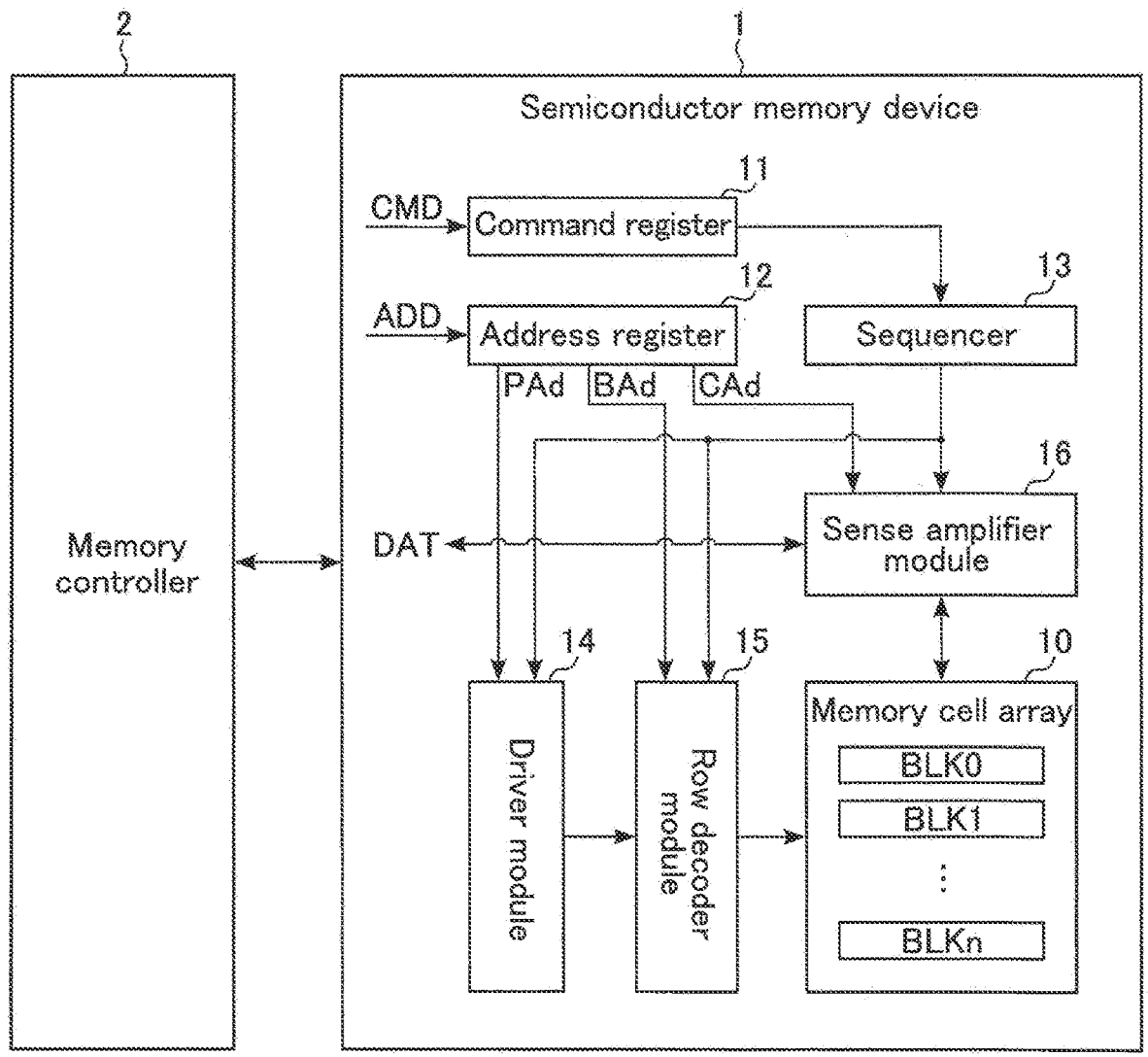
F I G. 1

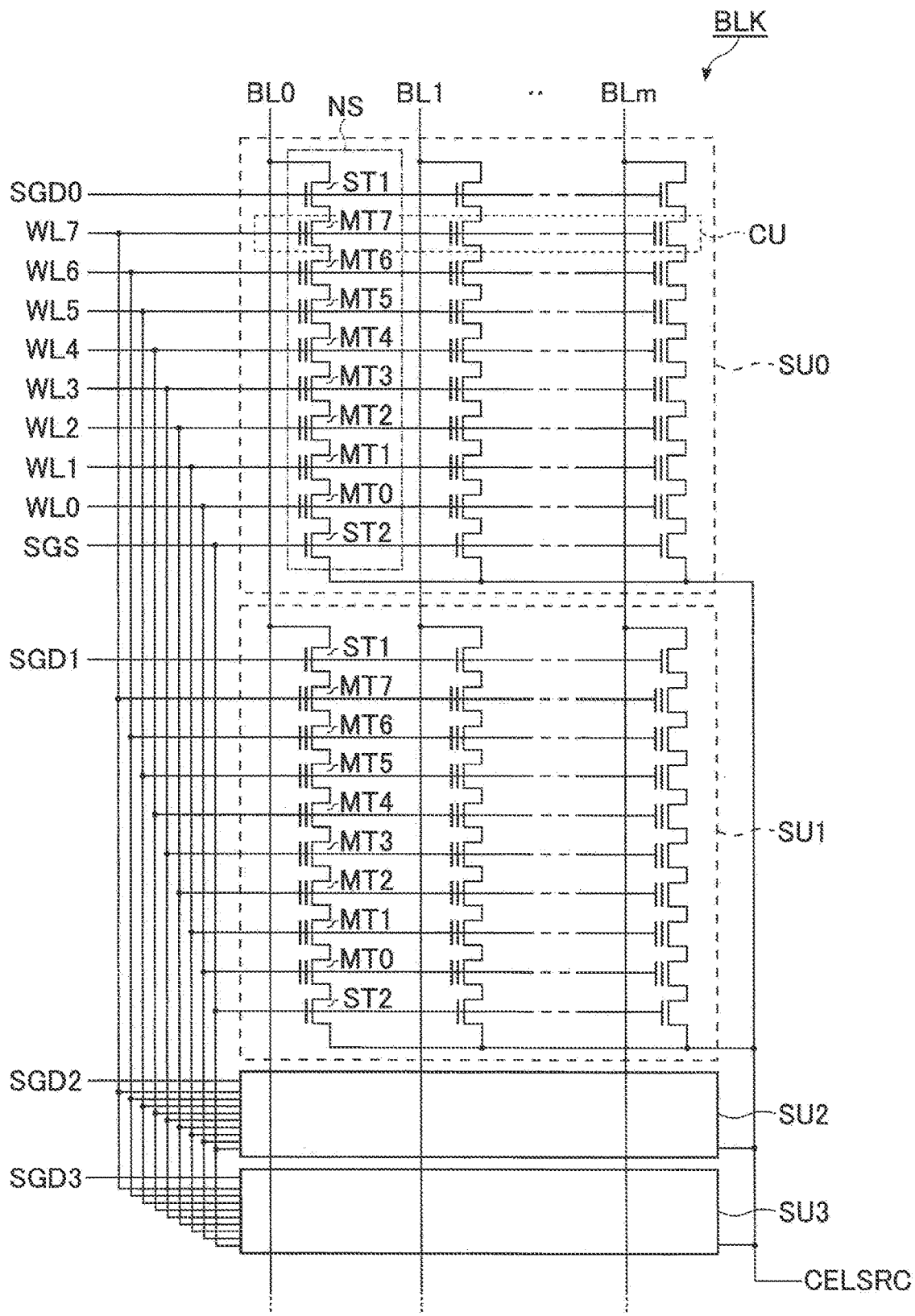
F I G. 2

Setting example of kick operation (First embodiment)

| | Kick operation | | |
|---|---|---|---|
| | BLX | BLC | CELSRC |
| First group | NEG | NEG | NEG |
| Second group | POS | POS | NEG |
| Third group | POS | POS | POS |

FIG. 13

Setting example of kick operation (Second embodiment)

| | Kick operation | | |
|---|---|---|---|
| | BLX | BLC | CELSRC |
| First group | NEG | NEG | NEG |
| Second group | – | – | NEG |
| Third group | POS | POS | POS |

Setting example of kick operation (Third embodiment)

| | Amount of change in read voltage | Kick operation | | |
|---|---|---|---|---|
| | | BLX | BLC | CELSRC |
| First group | 1~2Δ (Transition amount :small) | NEG | NEG | NEG |
| Second group | 3~4Δ (Transition amount :medium) | POS | POS | NEG |
| Third group | 5~6Δ (Transition amount :large) | POS | POS | POS |

Setting example of kick operation

|  | Kick operation | |
|---|---|---|
|  | BLC | CELSRC |
| Setting 1 | NEG | NEG |
| Setting 2 | NEG | – |
| Setting 3 | NEG | POS |
| Setting 4 | – | NEG |
| Setting 5 | – | – |
| Setting 6 | – | POS |
| Setting 7 | POS | NEG |
| Setting 8 | POS | – |
| Setting 9 | POS | POS |

F I G. 25

SEMICONDUCTOR MEMORY DEVICE

CROSS-REFERENCE TO RELATED APPLICATIONS

This application is a Continuation Application of U.S. application Ser. No. 18/084,363, filed Dec. 19, 2022, which is a Continuation Application of U.S. application Ser. No. 17/363,005, filed Jun. 30, 2021, and issued as U.S. Pat. No. 11,562,795 on Jan. 24, 2023, which is a Continuation Application of U.S. application Ser. No. 16/774,630, filed Jan. 28, 2020, and issued as U.S. Pat. No. 11,081,188 on Aug. 3, 2021, which is based upon and claims the benefit of priority from Japanese Patent Application No. 2019-126990, filed Jul. 8, 2019, the entire contents of all of which are incorporated by reference herein.

FIELD

Embodiments described herein relate generally to a semiconductor memory device.

BACKGROUND

There is known a NAND-type flash memory that is capable of storing data in a nonvolatile manner.

BRIEF DESCRIPTION OF THE DRAWINGS

FIG. 1 is a block diagram illustrating a configuration example of a semiconductor memory device according to a first embodiment;

FIG. 2 is a circuit diagram illustrating an example of a circuit configuration of a memory cell array in the semiconductor memory device according to the first embodiment;

FIG. 13 is a table illustrating setting examples of kick operations in a read operation of the semiconductor memory device according to the first embodiment;

FIG. 25 is a table illustrating an example of the settings of kick operations in a read operation of a semiconductor memory device according to a second modification of the first embodiment.

DETAILED DESCRIPTION

Figure 3:
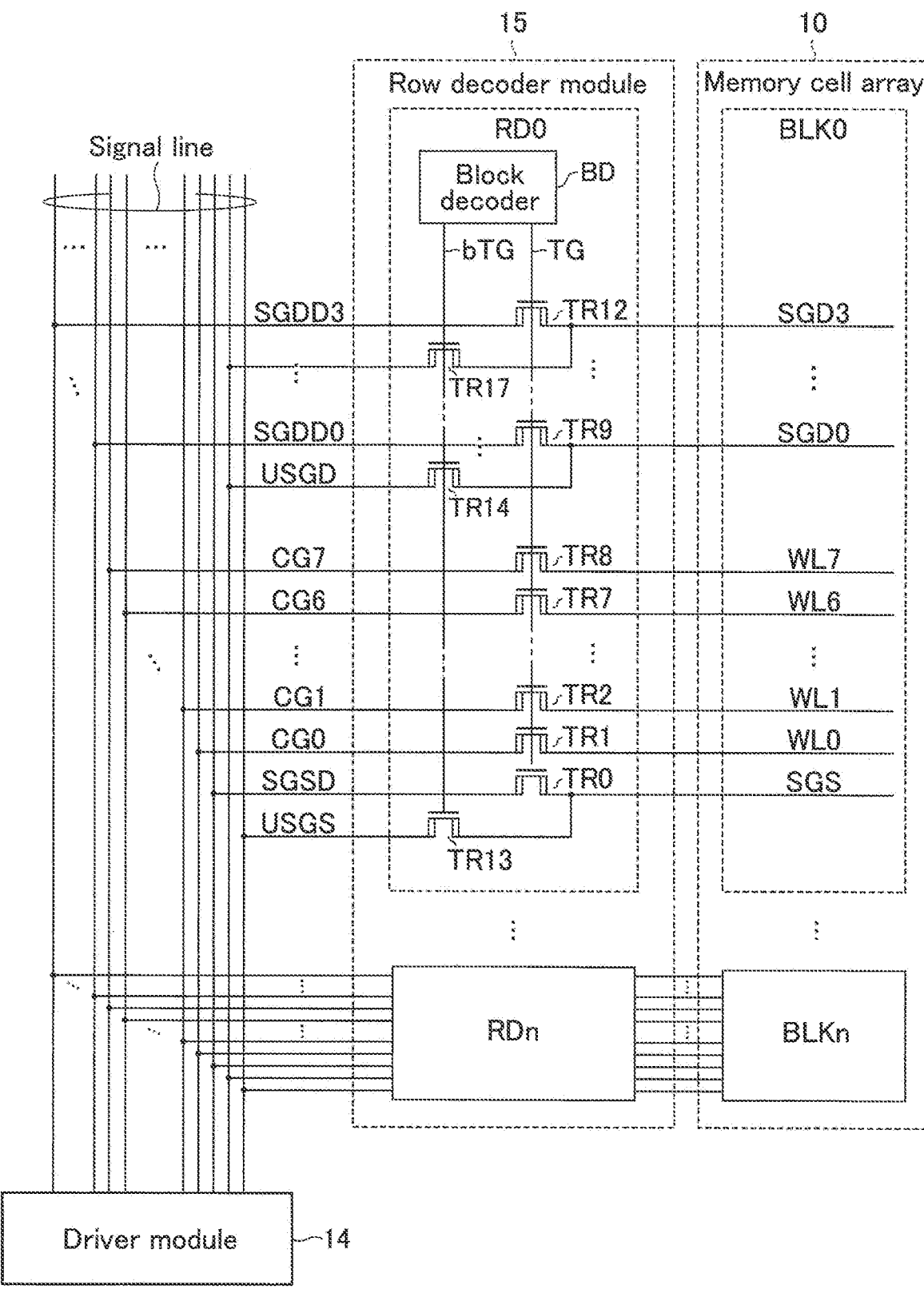
FIG. 3 is a circuit diagram illustrating an example of a circuit configuration of a row decoder module in the semiconductor memory device according to the first embodiment.

In general, according to one embodiment, a semiconductor memory device includes a bit line, a source line, a memory cell, a word line, a controller. The memory cell is connected between the bit line and the source line. The word line is connected to a gate of the memory cell. The controller is configured to execute a read operation. In the read operation, the controller is configured to: apply a first read voltage and a second read voltage different from the first read voltage to the word line, read data at each of first time and second time, the first time being time at which the first read voltage is applied to the word line, the second time being time at which the second read voltage is applied to the word line, apply the first voltage to the source line at each of the first time and the second time, apply a second voltage higher than the first voltage to the source line during the application of the first read voltage to the word line and before the first time, and apply a third voltage lower than the first voltage to the source line during the application of the second read voltage to the word line and before the second time.

Hereinafter, embodiments will be described with reference to drawings. Each of the embodiments illustrates an example of a device or a method for embodying the technical concept of the invention. The drawings schematically or conceptually illustrate the embodiments, and the size, ratio, and the like of each of the drawings are not necessarily identical to those of a real one. The technical concept of the present invention is not defined by the shape, structure, arrangements, etc. of structural elements disclosed herein.

In the following descriptions, structural elements having substantially the same function and configuration are denoted by the same reference symbols. Numeric characters after the letters constituting a reference symbol are referred to by reference symbols containing the same letters, and are used to distinguish elements having the same configuration. When the elements denoted by the reference symbols containing the same letters do not need to be distinguished from each other, these elements are referred to by the reference symbols containing only the letters.

[1] First Embodiment

Hereinafter, a semiconductor memory device 1 according to the first embodiment will be described.

[1-1] Configuration of Semiconductor Memory Device

[1-1-1] Overall Configuration of Semiconductor Memory Device 1

FIG. 1 illustrates a configuration example of the semiconductor memory device 1 according to the first embodiment. The semiconductor memory device 1 is a NAND flash memory capable of storing data in a non-volatile manner and can be controlled by an external memory controller 2.

As illustrated in FIG. 1, the semiconductor memory device 1 includes, for example, a memory cell array 10, a command register 11, an address register 12, a sequencer 13, a driver module 14, a row decoder module 15, and a sense amplifier module 16.

The memory cell array 10 includes a plurality of blocks BLK0 to BLKn (n is an integer of 1 or more). The block BLK includes an assembly of memory cells capable of storing data in a non-volatile manner and is used as, for example, an erase unit of data. The memory cell array 10 is provided with a plurality of bit lines and a plurality of word lines. Each memory cell is associated with one bit line and one word line. The detailed configuration of the memory cell array 10 will be described later.

The command register 11 holds command CMD received by the semiconductor memory 1 from the memory controller 2. The command CMD includes, for example, instructions for causing the sequencer 13 to execute a read operation, a write operation, an erase operation, etc.

The address register 12 holds address information ADD received by the semiconductor memory 1 from the memory controller 2. The address information ADD includes, for example, block address BAd, page address PAd, and column address CAd. For example, the block address BAd, the page address PAd, and the column address CAd are used to select a block BLK, a word line, and a bit line, respectively.

The sequencer 13 controls the operation of the whole semiconductor memory 1. For example, the sequencer 13 controls the driver module 14, the row decoder module 15, the sense amplifier module 16, etc., based on the command CMD held in the command register 11 and executes a read operation, a write operation, an erase operation, etc.

The driver module 14 generates voltages used for a read operation, a write operation, an erase operation, etc. The driver module 14 applies the generated voltages to a signal line corresponding to a selected word line based, for example, on the page address PAd held in the address register 12.

The row decoder module 15 selects one block BLK in a corresponding memory array 10 based on the block address BAd held in the address register 12. The row decoder module 15 transfers, for example, the voltages applied to the signal line corresponding to a selected word line to the selected word line in the selected block BLK.

The sense amplifier module 16 applies a desired voltage to each bit line in accordance with write data DAT received from the memory controller 2 in a write operation. In a read operation, the sense amplifier module 16 determines data stored in the memory cells based on the voltage of the bit line, and transfers, as read data DAT, a result of the determination to the memory controller 2.

The above-described semiconductor memory 1 and memory controller 2 may form one semiconductor device in combination. Examples of the semiconductor device include a memory card such as an SD™ card and a solid state drive (SSD).

[1-1-2] Circuit Configuration of Semiconductor Memory Device 1

(Circuit Configuration of Memory Cell Array 10)

FIG. 2 illustrates an example of the circuit configuration of the memory cell array 10 in the semiconductor memory device 1 according to the first embodiment, by extracting one block BLK out of the plurality of blocks BLK included in the memory cell array 10. As illustrated in FIG. 2, the block BLK includes, for example, four string units SU0 to SU3.

Each string unit SU includes a plurality of NAND strings NS respectively associated with bit lines BL0 to BLm (m is an integer of 1 or more). Each NAND string NS includes, for example, memory cell transistors MT0 to MT7, and select transistors ST1 and ST2. Each memory cell transistor MT includes a control gate and a charge storage layer and holds data in a nonvolatile manner. Each of the select transistors ST1 and ST2 is used to select the string unit SU in various operations.

In each NAND string NS, memory cell transistors MT0 to MT7 are coupled in series. The drain of the select transistor ST1 is connected to the associated bit line BL, and the source of the select transistor ST1 is connected to one end of the memory cell transistors MT0 to MT7 coupled in series. The drain of the select transistor ST2 is connected to the other end of the memory cell transistors MT0 to MT7 coupled in series. The source of the select transistor ST2 is connected to a source line CELSRC.

The control gates of the memory cell transistors MT0 to MT7 in the same block BLK are coupled in common to word lines WL0 to WL7, respectively. The gates of the respective select transistors ST1 in the string units SU0 to SU3 are coupled in common to select gate lines SGD0 to SGD3, respectively. The gates of the select transistors ST2 included in the same block BLK are coupled in common to a select gate line SGS.

In the circuit configuration of the memory cell array 10 described above, bit lines BL are shared by the NAND string NS to which the same column address is allocated in each string unit SU. The source line CELSRC is shared, for example, among a plurality of blocs BLK.

An assembly of the plurality of memory cell transistors MT coupled to common word lines in one string unit SU is referred to, for example, as a "cell unit CU". For example, the memory capacity of one cell unit CU including memory cell transistors MT respectively storing 1-bit data is defined as "1-page data". The cell unit CU can have a memory capacity of two or more pages, in accordance with the number of bits of data to be stored in each memory cell transistor MT.

The circuit configuration of the memory cell array 10 in the semiconductor memory device 1 according to the first embodiment is not limited to the configuration described above. For example, the number of string units SU included in each block BLK, the number of memory cell transistors MT included in each NAND string NS, and the number of select transistors ST1 and ST2 included in each NAND string NS may be set in a discretionary manner.

(Circuit Configuration of Row Decoder Module 15) FIG. 3 illustrates an example of a circuit configuration of the row decoder module 15 in the semiconductor memory device 1 according to the first embodiment. As illustrated in FIG. 3, the row decoder module 15 is coupled to the driver module 14, for example, via signal lines CG0 to CG7, SGDD0 to SGDD3, SGSD, USGD, and USGS.

Hereinafter, focusing on row decoder RD0 corresponding to block BLK0, a detailed circuit configuration of the row decoder RD will be described. The row decoder RD includes, for example, a block decoder BD, transfer gate lines TG and bTG, and transistors TR0 to TR17.

The block decoder BD decodes a block address BAd. The block decoder BD applies a desired voltage to each of the transfer gates TG and bTG, based on a decoding result. The voltage applied to the transfer gate line TG and the voltage applied to the transfer gate line bTG have a complementary relationship. In other words, the inverted signal of that of the transfer gate line TG is input to the transfer gate line bTG.

The transistors TR0 to TR17 are respectively high-breakdown-voltage N-type MOS transistors. The respective gates of the transistors TR0 to TR12 are coupled in common to the transfer gate line TG. The respective gates of the transistors TR13 to TR17 are coupled in common to the transfer gate line bTG. Each transistor TR is connected between a signal line wired from the driver module 14 and an interconnect provided in corresponding one block BLK.

Specifically, the drain of the transistor TR0 is coupled to the signal line SGSD. The source of the transistor TR0 is coupled to the select gate line SGS. The respective drains of the transistors TR1 to TR8 are coupled to signal lines CG0 to CG7, respectively. The respective sources of the transistors TR1 to TR8 are coupled to word lines WL0 to WL7, respectively. The respective drains of the transistors TR9 to TR12 are coupled to signal lines SGDD0 to SGDD3, respectively. The respective sources of the transistors TR9 to TR12 are coupled to select gate lines SGD0 to SGD3, respectively.

The drain of the transistor TR13 is coupled to the signal line USGS. The source of the transistor TR13 is coupled to the signal line SGS. The respective drains of the transistors TR14 to TR17 are coupled in common to the signal line USGD. The respective sources of the transistors TR14 to TR17 are coupled to the select gate lines SGD0 to SGD3, respectively.

For example, the signal lines CG0 to CG7 function as global word lines, and the word lines WL0 to WL7 function as local word lines. The signal lines SGDD0 to SGDD3 and SGSD function as global transfer gate lines, and the select gate lines SGD0 to SGD3 and SGS function as local transfer gate lines.

With the above-described configuration, the row decoder module 15 can select a block BLK. Specifically, in various operations, a block decoder BD corresponding to a selected block BLK applies voltages of "H" level and "L" level to the transfer gate lines TG and bTG, respectively, and a block decoder BD corresponding to a non-selected block BLK applies the voltages of "L" level and "H" to the transfer gate lines TG and bTG, respectively.

The above-described circuit configuration of the row decoder module 15 is presented by way of example only and may be suitably modified. For example, the number of transistors TR included in the row decoder module 15 can be designed based on the number of interconnects provided in each block BLK.

(Circuit Configuration of Sense Amplifier Module 16)

Figure 4:
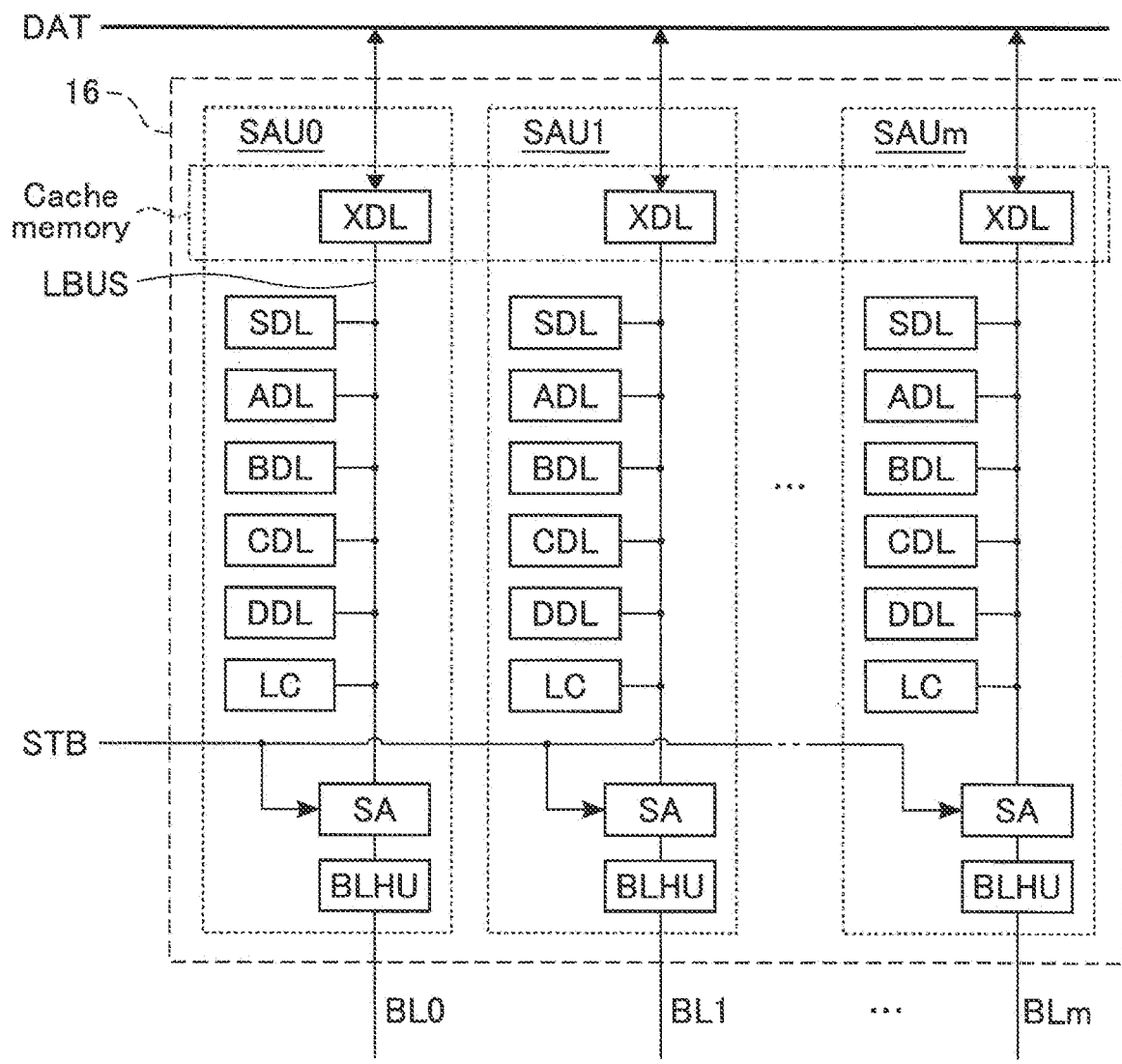
FIG. 4 is a circuit diagram illustrating an example of a circuit configuration of a sense amplifier module in the semiconductor memory device according to the first embodiment.

FIG. 4 illustrates an example of a circuit configuration of the sense amplifier 16 in the semiconductor memory device 1 according to the first embodiment. As illustrated in FIG. 4, each sense amplifier unit SAU includes, for example, a bit line hookup BLHU, a sense amplifier SA, logical circuit LC, and latch circuits SDL, ADL, BDL, CDL, DDL, and XDL.

The bit line hookup BLHU includes high-breakdown-voltage transistors connected between an associated bit line BL and an associated sense amplifier SA. The sense amplifier SA, logical circuit LC, and latch circuits SDL, ADL, BDL, CDL, DDL, and XDL are coupled in common to a bus LBUS. The latch circuits SDL, ADL, BDL, CDL, DDL, and XDL can receive and transmit data between one another.

For example, a control signal STB generated by the sequencer 13 is input to each sense amplifier SA. The sense amplifier SA determines whether the data read to the associated bit line BL is "0" or "1", based on the timing at which the control signal STB is asserted. That is, the sense amplifier SA determines data stored in the selected memory cells, based on the voltage of the bit line BL.

The logical circuit LC executes various logical calculations with use of data held in the latch circuits SDL, ADL, BDL, CDL, DDL, and XDL connected to the common bus LBUS. Specifically, the logical circuit LC can execute an AND operation, an OR operation, a NAND operation, an EXNOR operation, etc. by using data held in two latch circuits.

The respective latch circuits SDL, ADL, BDL, CDL, DDL, and XDL hold data temporarily. The latch circuit XDL is used for input/output of data DAT between the input/output circuit and the sense amplifier unit SAU in the semiconductor memory device 1. The latch circuit XDL may also be used as, for example, a cache memory of the semiconductor memory device 1. If at least the latch circuit XDL is vacant, the semiconductor memory device 1 can be in a ready state.

Figure 5:
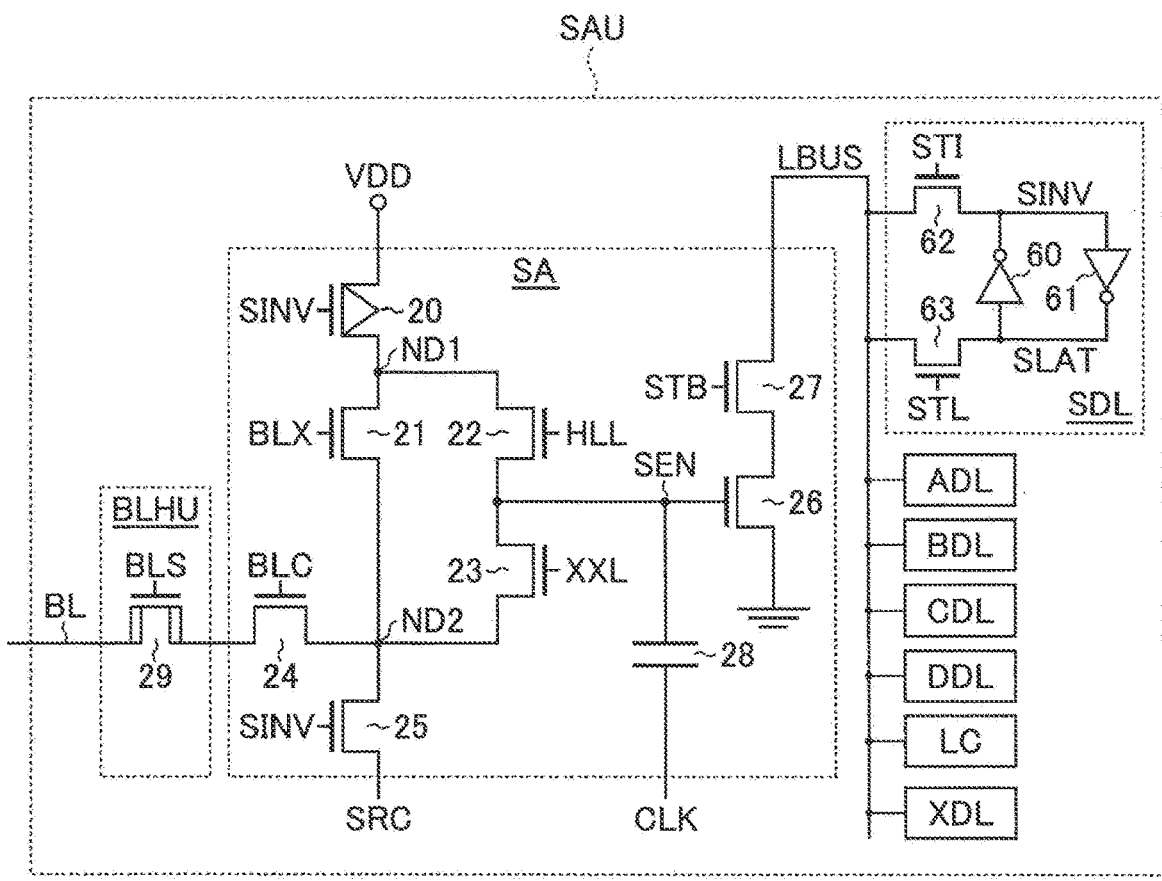
FIG. 5 is a circuit diagram illustrating an example of a circuit configuration of a sense amplifier unit, included in the sense amplifier module in the semiconductor memory device according to the first embodiment.

FIG. 5 illustrates an example of a circuit configuration of the sense amplifier unit SAU in the semiconductor memory device 1 according to the first embodiment. As illustrated in FIG. 5, the sense amplifier SA includes transistors 20 to 27 and a capacitor 28, and the bit line hookup BLHU includes a transistor 29. The transistor 20 is a P-type MOS transistor. The respective transistors 21 to 27 are N-type MOS transistors. The transistor 29 is an N-type MOS transistor with a higher breakdown voltage than that in each of the transistors 20 to 27.

The source of the transistor 20 is coupled to a power supply source line. The drain of the transistor 20 is coupled to a node ND1. The gate of the transistor 20 is coupled, for example, to a node SINV in the latch circuit SDL. The drain of the transistor 21 is coupled to the node ND1. The source of the transistor 21 is coupled to a node ND2. A control signal BLX is input to the gate of the transistor 21. The drain of the transistor 22 is coupled to the node ND1. The source of the transistor 22 is coupled to a node SEN. A control signal HLL is input to the gate of the transistor 22.

The drain of the transistor 23 is coupled to the node SEN. The source of the transistor 23 is coupled to the node ND2. A control signal XXL is input to the gate of the transistor 23. The drain of the transistor 24 is coupled to the node ND2. A control signal BLC is input to the gate of the transistor 24. The drain of the transistor 25 is coupled to the node ND2. The source of the transistor 25 is coupled to a node SRC. The gate of the transistor 25 is coupled, for example, to the node SINV in the latch circuit SDL.

The source of the transistor 26 is grounded. The gate of the transistor 26 is coupled to the node SEN. The drain of the transistor 27 is coupled to the bus LBUS. The source of the transistor 27 is coupled to the drain of the transistor 26. A control signal STB is input to the gate of the transistor 27. One electrode of the capacitor 28 is coupled to the node SEN. A clock CLK is input to the other electrode of the capacitor 28.

The drain of the transistor 29 is coupled to the source of the transistor 24. The source of the transistor 29 is coupled to a bit line BL. A control signal BLS is input to the gate of the transistor 29.

The latch circuit SDL includes, for example, an inverters 60 and 61, and n-channel MOS transistors 62 and 63. The input node of the inverter 60 is coupled to a node SLAT, and the output node of the inverter 60 is coupled to the node SINV. The input node of the inverter 61 is coupled to the node SINV, and the output node of the inverter 61 is coupled to the node SLAT. One end of the transistor 62 is coupled to the node SINV, and the other end of the transistor 62 is coupled to the bus LBUS. A control signal STI is input to the gate of the transistor 62. One end of the transistor 63 is coupled to the node SLAT, and the other end of the transistor 63 is coupled to the bus LBUS. A control signal STL is input to the gate of the transistor 63. For example, data held in the node SLAT corresponds to data held in the latch circuit SDL, and data held in the node SINV corresponds to inverted data of the data held in the node LAT.

The circuit configurations of the latch circuit ADL, BDL, CDL, DDL, and XDL are similar to those of the latch circuit SDL, for example. The latch circuit holds data, for example, in a node ALAT, and holds the inverted data of the data, for example, in a node AINV. For example, a control signal ATI is input to the gate of the transistor 62 of the latch circuit ADL, and a control signal ATL is input to the gate of the transistor 63 of the latch circuit ADL. The descriptions on the latch circuits BDL, CDL, DDL, and XDL are omitted.

In the above-described circuit configuration of the sense amplifier unit SAU, for example, a power supply voltage VDD is applied to the power supply line coupled to the source of the transistor 20. For example, a ground voltage VSS is applied to the node SRC. Each of the control signals BLX, HLL, XXL, BLC, STB, and BLS, and the clock CLK is generated, for example, by the sequencer 13.

The circuit configuration of the sense amplifier 16 in the semiconductor memory device 1 according to the first embodiment is not limited to the above-described circuit configuration. For example, the number of latch circuits included in each sense amplifier unit SAU may be suitably changed based on the number of pages to be stored by one cell unit CU. The logical circuit LC in the sense amplifier unit SAU may be omitted if a logical operation can be executed with use of only a latch circuit or latch circuits in the sense amplifier unit SAU.

[1-1-3] Structure of Semiconductor Memory Device 1

Hereinafter, an example of the structure of the semiconductor memory device 1 in the embodiment will be described.

In the drawings referred to in the following descriptions, an X direction corresponds to the extending direction of word lines WL, a Y direction corresponds to the extending direction of bit lines BL, and a Z direction corresponds to a direction perpendicular to the surface of the semiconductor substrate used as a semiconductor layer on which the semiconductor memory device 1 is formed. For viewability purposes, hatching is appropriately added to the plan views. The hatching added to the plan views is not necessarily associated with the materials or characteristics of the structural elements to which the hatching is added. In the present specification, for viewability purposes, structural elements, such as interconnects and contacts, are suitably omitted.

(Planar layout of Memory Cell Array 10)

Figure 6:
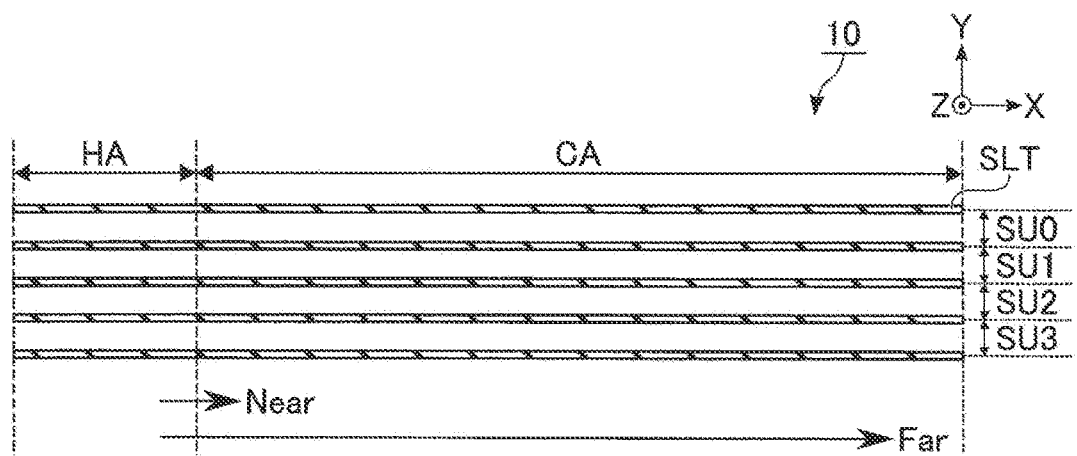
FIG. 6 is a plan view illustrating an example of a planar layout of a memory cell array in the semiconductor memory device according to the first embodiment.

FIG. 6 illustrates an example of a planar layout of a memory cell array 10 in the semiconductor memory device 1 according to the first embodiment, by extracting a region corresponding to one block BLK (i.e., string units SU0 to SU3). As illustrated in FIG. 6, the memory cell array 10 includes a plurality of slits SLT. The planar layout of the memory cell array 10 is split into a plurality of cell areas CA and a plurality of hookup areas HA, for example, in the X direction.

The plurality of slits SLT are provided so that they respectively extend along the X direction and traverse the area of the memory cell array 10 in the X direction. Also, the plurality of slits SLT are arranged in the Y direction. Each slit SLT has a structure with an insulating member and a conductive member being embedded inside thereof, is provided in the same interconnect layer, and divides adjacent conductive layers via said slit SLT. Specifically, the slits SLT divide a plurality of interconnect layers respectively corresponding, for example, to word lines WL0 to WL7 and select gate lines SGD and SGS.

Each cell area CA is an area in which a NAND string NS is formed. Each hookup area HA is an area in which contacts are formed for electrically coupling the row decoder module 15 and any one of the word lines WL and select gate lines SGS and SGD, coupled to each NAND string NS. The hookup areas HA are provided on one side in the X direction of the memory cell array 10 and adjacent to the cell areas CA. In the present specification, within each cell area CA, a portion where the distance from a hookup area(s) is short is referred to as a "near end (Near)", and a portion where the distance from a hookup area(s) is long is referred to as a "far end (Far)". These terms are used in the following descriptions.

In the planar layout of the memory cell array 10 in the above-described embodiment, respective areas partitioned by the slits SLT correspond to one string unit SU. That is, in this example, the string units SU0 to SU3 each extending in the X direction are arranged in the Y direction. In the memory cell array 10, for example, the layout illustrated in FIG. 6 is repeatedly arranged in the Y direction.

(Structure of Memory Cell Array 10 in Cell Area CA)

Figure 7:
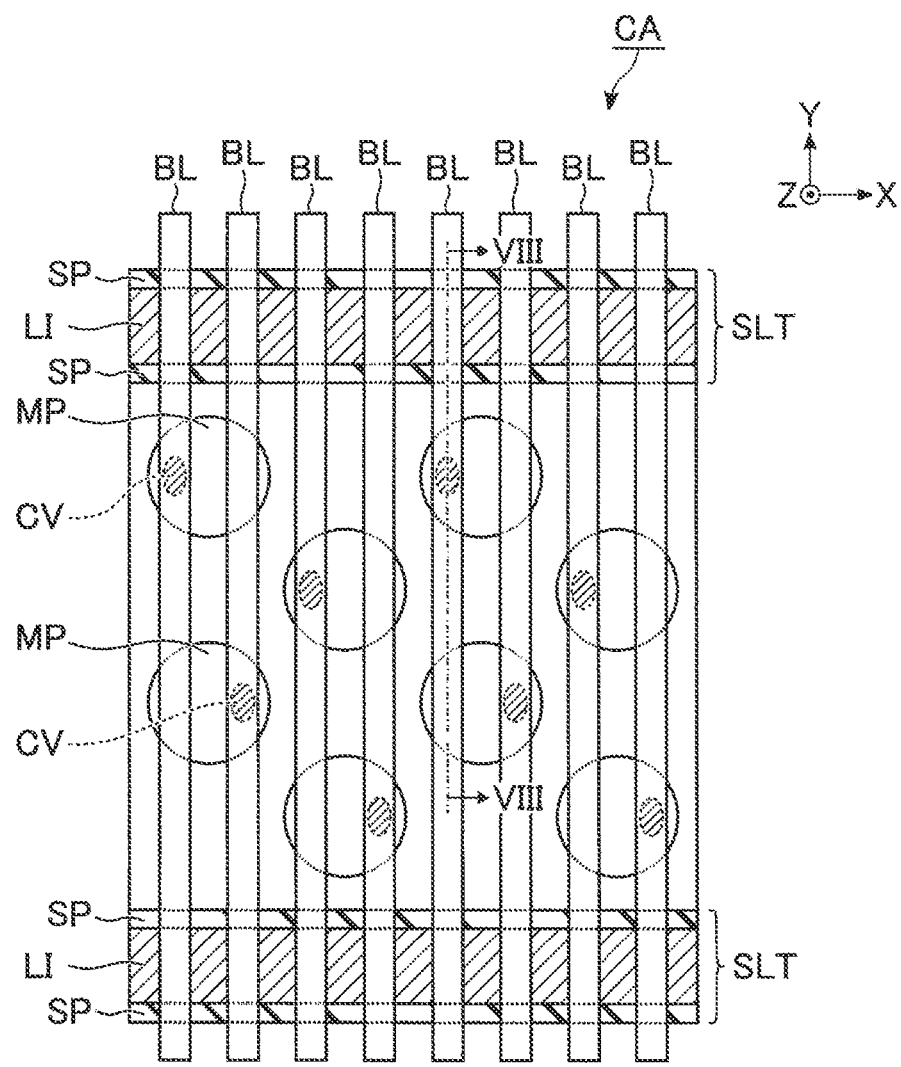
FIG. 7 is a plan view illustrating an example of a detailed planar layout of a cell area of a memory cell array included in the semiconductor memory device according to the first embodiment.

FIG. 7 illustrates an example of a detailed planar layout in a cell area CA of the memory cell array 10 in the semiconductor memory device 1 according to the first embodiment, by extracting a part of the area corresponding to one string unit SU. As illustrated in FIG. 7, the memory cell array 10 includes, in the cell area CA, for example, a plurality of memory pillars MP, a plurality of contacts CV, and a plurality of bit lines BL. Each slit SLT includes, for examples, a contact LI and spacers SP.

Each memory pillar MP functions, for example, as a single NAND string NS. The plurality of memory pillars MP are arranged in a four-row stagger pattern, for example, in a region between two adjacent slits SLT. The number and the arrangement of the memory pillars MP between two adjacent slits SLT are not limited thereto and may be suitably changed.

At least a part of each of the plurality of bit lines BL extends in the Y direction, and the parts are arranged in the X direction. Each bit line BL is arranged so as to overlap at least one memory pillar MP for each string unit SU. In this example, in each memory pillar MP, two bit lines BL are arranged so as to overlap said each memory pillar MP. A contact CV is provided between said memory pillar MP and one bit line BL out of the plurality of bit lines BL overlapping a memory pillar MP. Each memory pillar MP is electrically coupled to a corresponding bit line BL via a contact CV. One contact CV is coupled to one bit line BL, for example, in respective spaces partitioned by the slits SLT.

Inside each slit SLT, at least a part of the contact LI is provided extending in the X direction. The spacer SP is provided on a side surface of the contact LI. A space between the contact LI and the plurality of interconnect layers adjacent to the slit SLT is insulated with a spacer SP. The contact LI is used as the source line CELSRC. The contact LI may be a semiconductor or a metal. As the spacer SP, an insulator, such as a silicon oxide ($SiO_2$) and a silicon nitride (SiN), is used.

Figure 8:
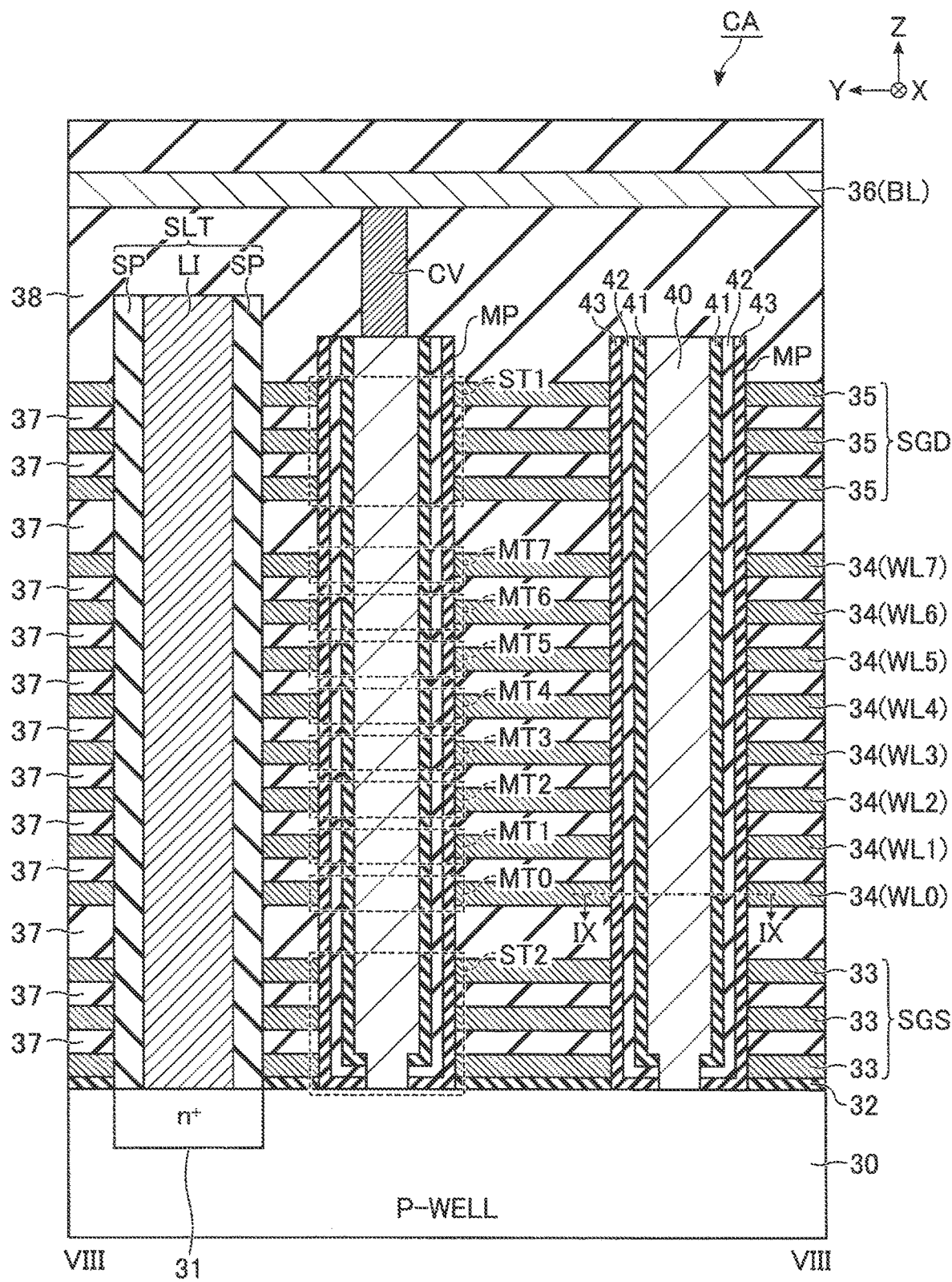
FIG. 8 is a cross-sectional view along the VIII-VIII line in FIG. 7, illustrating an example of a cross-sectional structure of the cell area of the memory cell array in the semiconductor memory device according to the first embodiment.

FIG. 8 is a cross-sectional view along the VIII-VIII line in FIG. 7, which illustrates an example of a cross-sectional structure in a cell area CA of the memory cell array 10 in the semiconductor memory device 1 according to the first embodiment. As illustrated in FIG. 8, the memory cell array 10 further includes P-WELL area 30, insulating layers 32, 37, and 38, and conductive layers 33 to 36.

The P-WELL area 30 is provided in the vicinity of the surface of the semiconductor substrate and includes a N-type semiconductor region 31. The N-type semiconductor region 31 is a N-type impurity diffusion region provided in the vicinity of the surface of the P-WELL area 30. The N-type semiconductor region 31 is doped with, for example, phosphorus (P).

An insulating layer 32 is provided on the P-WELL area 30. A conductive layer 33 and an insulating layer 37 are alternately stacked on the insulating layer 32. The conductive layer 33 is formed, for example, in a plate shape extending along an X-Y plane. The plurality of stacked conductive layers 33 are used as the select gate line SGS. The conductive layers 33 contain, for example, tungsten (W).

A conductive layer 34 and an insulating layer 37 are alternately stacked above the uppermost conductive layer 33. The conductive layer 34 is formed, for example, in a plate shape extending along an X-Y plane. A plurality of the stacked conductive layers 34 are used as the word lines WL0 to WL7, respectively, in the order of layers from the P-WELL area 30 side. The conductive layers 34 contain, for example, tungsten (W).

A conductive layer 35 and the insulating layer 37 are alternately stacked above the uppermost conductive layer 34. The conductive layer 35 is formed, for example, in a plate shape extending along the X-Y plane. The plurality of stacked conductive layers 35 are used as the select gate line SGD. The conductive layers 35 contain, for example, tungsten (W).

A conductive layer 36 is provided above the uppermost conductive layer 35 via an insulating layer 38. The conductive layer 36 is formed, for example, in a line shape extending in the Y direction and is used as a bit line BL. That is, a plurality of the conductive layers 36 are arranged along the X direction in an area (not shown). The conductive layers 36 include, for example, copper (Cu).

Each memory pillar MP is provided extending along the Z direction and penetrates through the insulating layers 32 and 37 and the conductive layers 33 to 35. The bottom of each memory pillar MP is in contact with the P-WELL area 30. Each memory pillar MP includes, for example, a semiconductor layer 40, a tunnel insulating film 41, an insulating film 42, and a block insulating film 43.

A semiconductor layer 40 is provided extending along the Z direction. For example, the upper end of the semiconductor layer 40 is included in a layer higher than the uppermost conductive layer 35, and the lower end of the semiconductor layer 40 is in contact with the P-WELL area 30. The tunnel insulating film 41 covers a side surface of the semiconductor layer 40. The insulating film 42 covers a side surface of the tunnel insulating film 41. The block insulating film 43 covers a side surface of the insulating film 42. Both the tunnel insulating film 41 and the block insulating film 43 include, for example, a silicon oxide ($SiO_2$). The insulating film 42 includes, for example, a silicon nitride (SiN).

A columnar contact CV is provided on the semiconductor layer 40 within the memory pillar MP. The contact CV corresponding to one memory pillar MP out of two memory pillars MP is illustrated in the area. The contact CV is coupled, in an area (not shown), to the memory pillar MP in said area to which no contact CV is coupled.

A single conductive layer 36, i.e., one bit line BL is in contact with the upper surface of the contact CV. As described above, a single contact CV is coupled to a single conductive layer 36 (one bit line BL) in respective spaces partitioned by slits SLT. That is, one memory pillar MP between adjacent two slits SLT is electrically coupled to each of the conductive layers 36.

The slit SLT is formed, for example, to have a shape extending along the X-Z plane and divides the insulating layers 32 and 37 and the conductive layers 33 to 35. The upper end of the slit SLT is included in a layer between the uppermost conductive layer 35 and the conductive layer 36. The lower end of the slit SLT is in contact with the N-type semiconductor region 31 within the P-WELL area 30. Specifically, the contact LI in the slit SLT is formed to have a plate shape extending in the X-Z plane. The bottom of the contact LI is electrically coupled to the N-type semiconductor region 31. A spacer SP in the slit SLT covers a side surface of the contact LI. The contact LI is isolated from each of the conductive layers 33 to 35 by spacers SP.

Figure 9:
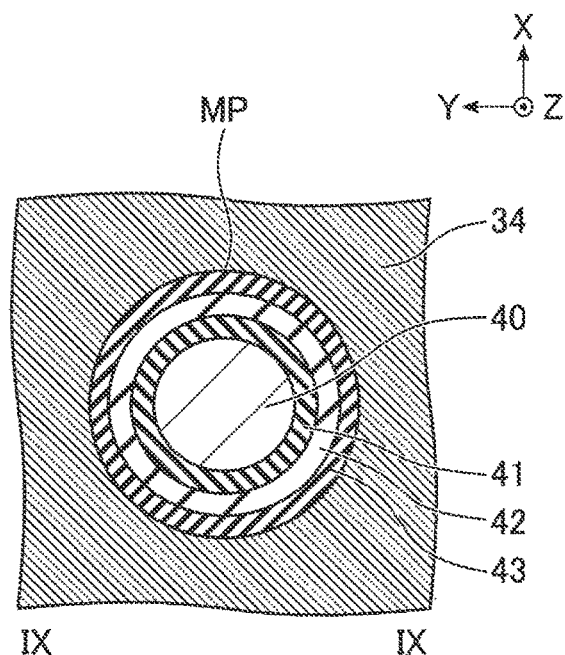
FIG. 9 is a cross-sectional view along an IX-IX line in FIG. 8, illustrating an example of a cross-sectional structure of a memory pillar in the semiconductor according to the first embodiment.

FIG. 9 is a cross-sectional view along the IX-IX line in FIG. 8 and illustrates an example of a cross-sectional structure of the memory pillar MP in the semiconductor memory device 1 according to the first embodiment, by extracting a cross-section of the memory pillar MP in a layer parallel to the surface of the semiconductor substrate and including the conductive layer 34. As illustrated in FIG. 9, in the layer including the conductive layer 34, the semiconductor layer 40 is provided at a central portion of the memory pillar MP, for example. The tunnel insulating film 41 surrounds the side surface of the semiconductor layer 40. The insulating film 42 surrounds the side surface of the tunnel insulating film 41. The block insulating film 43 surrounds the side surface of the insulating film 42. The conductive layer 34 surrounds the side surface of the block insulating film 43.

In the above-described structure of the memory pillar MP, a portion where the memory pillar MP intersects with the conductive layer 33 functions as a select transistor ST2. A portion where the memory pillar MP intersects with the conductive layer 34 functions as a memory cell transistor MT. A portion where the memory pillar MP intersects with the conductive layer 35 functions as a select transistor ST1. That is, the semiconductor layer 40 functions as each channel for the memory cell transistors MT0 to MT7 and the select transistors ST1 and ST2. The insulating film 42 functions as a charge storage layer of each memory cell transistor MT.

(Structure of Memory Cell Array 10 in Hookup Area HA)

Figure 10:
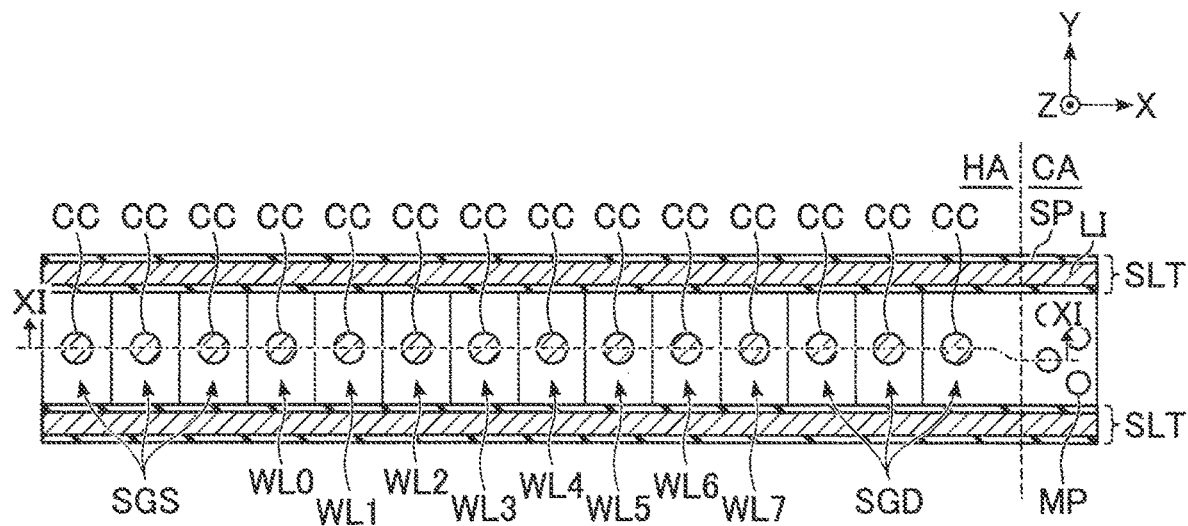
FIG. 10 is a plan view illustrating an example of a detailed planar layout in a hookup area of the memory cell array in the semiconductor memory device according to the first embodiment.

FIG. 10 is an example of a detailed planar layout in a hookup area HA of a memory cell array 10 in the semiconductor memory device 1 according to the first embodiment, by extracting a region corresponding to a single string unit SU. FIG. 10 also shows an end of a cell area CA positioned near the hookup area HA. As illustrated in FIG. 10, in the hookup area HA, the select gate lines SGS, the word lines WL0 to WL7, and the select gate lines SGD respectively have a terrace portion which is not overlapping a conductive layer provided as a layer higher than their own at their ends.

The terrace portion has a step-like, terrace or rimstone shape, for example. Specifically, a step is present between select gate line SGS and word line WL0, between a word line WL0 and word line WL1, . . . , between word line WL 6 and word line WL7, and between word line WL7 and select gate line SGD, respectively. Respective ends of the select gate lines SGS, word lines WL0 to WL7, and select gate lines SGD are arranged between two adjacent slits SLT. The structure of the slit SLT in the hookup area HA is the same as that in the cell area CA.

In the hookup area HA, the memory cell array 10 further includes a plurality of contacts CC. The plurality of contacts CC are arranged in the select gate lines SGS, word lines WL0 to WL7, and select gate lines SGD, respectively. That is, the plurality of contacts CC are electrically coupled to the word lines WL0 to WL7 and the select gate lines SGD and SGS, respectively. Each of the word lines WL0 to WL7 and select gate lines SGD and SGS is electrically coupled to the row decoder module 15 via corresponding one contact CC.

Figure 11:
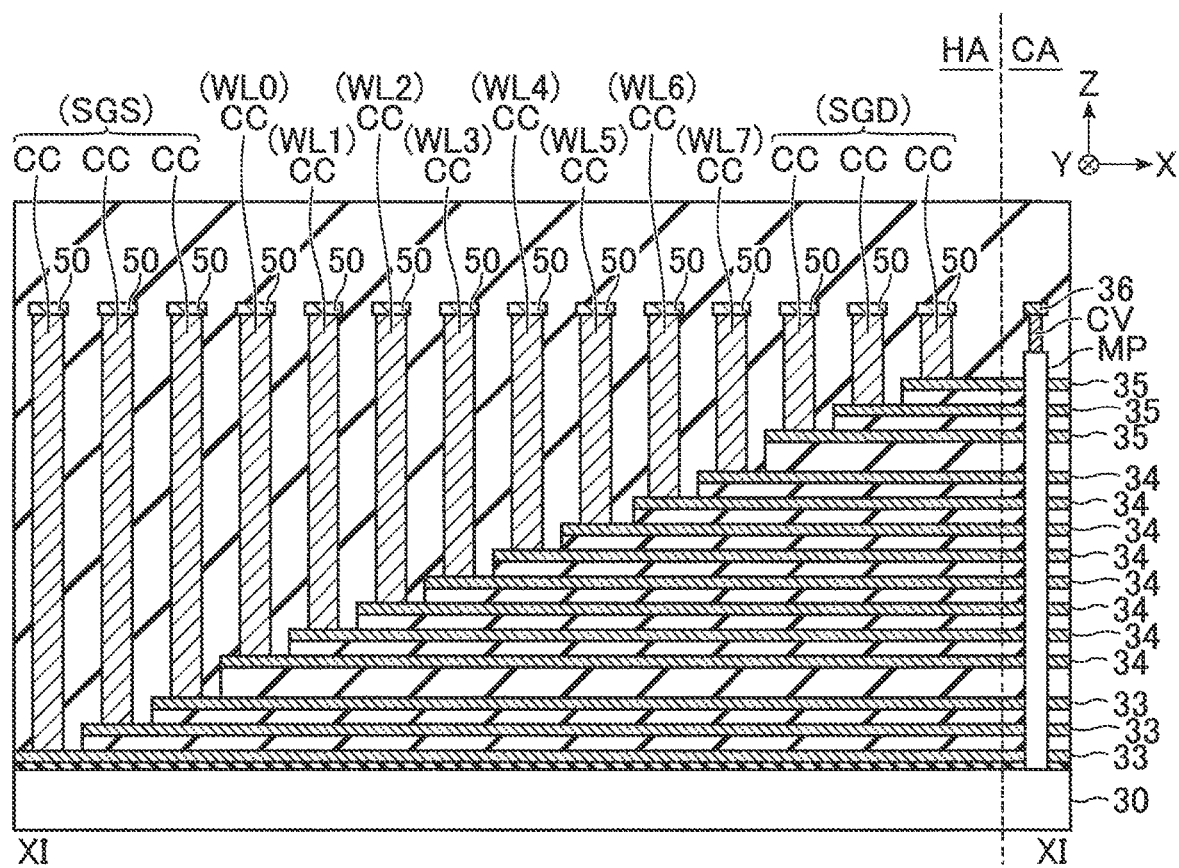
FIG. 11 is a cross-sectional view along the XI-XI line in FIG. 10, illustrating an example of a cross-sectional structure in a hookup area of a memory cell array in the semiconductor memory device according to the first embodiment.

FIG. 11 is a cross-section along the XI-XI line in FIG. 10 and illustrates an example of a cross-sectional structure in the hookup area HA of the memory cell array 10 in the semiconductor memory device 1 according to the first embodiment. As illustrated in FIG. 11, ends of the plurality of conductive layers respectively corresponding to the word line WL and the select gate lines SGD and SGS are provided in a stepwise manner. Furthermore, in the hookup area HA, the memory cell array 10 further includes a plurality of conductive layers 50.

Specifically, a single contact CC is provided on each terrace portion of the plurality of conducting layers 33 respectively corresponding to the select gate lines SGS, the plurality of conductive layers 34 respectively corresponding to the word lines WL0 to WL7, and the plurality of conductive layers 35 respectively corresponding to the select gate lines SGD. A single conductive layer 50 is provided on each contact CC, and said contact CC and the conductive layer 50 is electrically coupled.

The configuration of the memory cell array 10 in the hookup area HA is not limited to the above-described one. For example, the steps of the ends of the stacked word lines WL and the select gate lines SGD and SGS may be formed in the Y direction. The ends of the stacked word lines WL and select gate lines SGD and SGS may be formed to have a discretional number of steps. The step structure formed may differ among the select gate line SGS, the word line WL, and the select gate line SGD.

[1-1-4] Storage Scheme of Memory Cell Transistor MT

Figure 12:
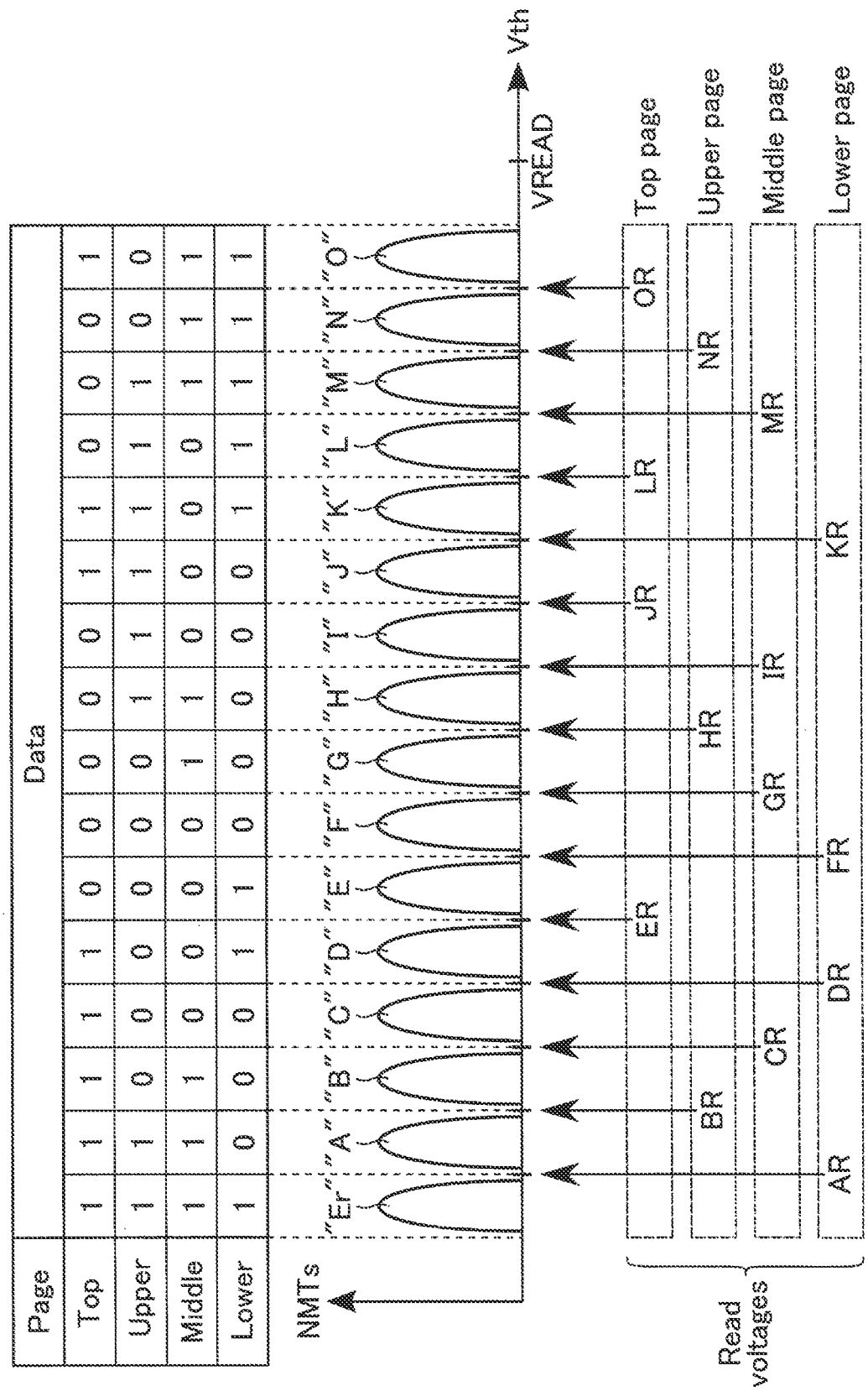
FIG. 12 is a diagram illustrating an example of data allocations used in a memory transistor in the semiconductor memory device according to the first embodiment.

FIG. 12 illustrates an example of a distribution of threshold voltage (threshold voltage distribution) of memory cell transistors MT and data allocation in the case where Quadruple-Level Cell (QLC) scheme is used, in which 4-bit data is stored in one memory cell transistor MT. In the threshold voltage distribution illustrated in FIG. 12, the ordinate axis corresponds to the number of NMTs of memory cell transistors MT, and the abscissa axis corresponds to threshold voltages Vth of the memory cell transistors MT.

As illustrated in FIG. 12, the threshold voltage distribution of the memory cell transistors MT to which the QLC scheme is applied is categorized into 16 states. The 16 states of threshold voltage distributions in the QLC scheme are referred to, for example, as "Er" state, "A" state, "B" state, "C" state, "D" state, "E" state, "F" state, "G" state, "H" state, "I" state, "J" state, "K" state, "L" state, "M" state, "N" state, and "O" state, in the ascending order of threshold voltages. For example, the following 4-bit data is allocated to each of the 16 states of threshold voltage distributions.

(Ex.) Name of State: "(lower bit/middle bit/upper bit/top bit)" data

"Er" state: "1111" data
"A" state: "0111" data
"B" state: "0101" data
"C" state: "0001" data
"D" state: "1001" data
"E" state: "1000" data
"F" state: "0000" data
"G" state: "0100" data
"H" state: "0110" data
"I" state: "0010" data
"J" state: "0011" data
"K" state: "1011" data
"L" state: "1010" data
"M" state: "1110" data
"N" state: "1100" data
"O" state: "1101" data A read voltage is set between adjacent threshold voltage distributions, respectively. For example, a read voltage AR is set between the "Er" state and the "A" state. A read voltage BR is set between the "A" state and the "B" state. A read voltage CR is set between the "B" state and the "C" state. In the following descriptions, each voltage DR, ER, FR, GR, HR, IR, JR, KR, LR, MR, NR, and OR is set between adjacent two states, in the same manner. A read pass voltage VREAD is set to a voltage higher than that of "O" state. A memory cell transistor MT in which the read pass voltage VREAD is applied to the control gate is in the ON state regardless of data to be stored therein.

When the above-described allocation of data is used, 1-page data (lower page data) constituted by lower bits becomes definite through a read operation using the read voltages AR, DR, FR, and KR. 1-page data constituted by middle bits (middle page data) becomes definite through a read operation using read voltages CR, GR, IR, and MR. 1-page data constituted by upper bits (upper page data) becomes definite through a read operation using read voltages BR, HR, and NR. 1-page data constituted by the top bits (top page data) becomes definite through a read operation using read voltages ER, JR, LR, and OR.

Such a data allocation is referred to, for example, as "4-4-3-4 code", since the lower page data, the middle page data, the upper page data, and the top page data are respectively become definite by performing the read operation four times, four times, three times, and four times, respectively. In the present specification, a case will be described as an example in which "4-4-3-4 code" is used for the data allocation of a memory cell transistor MT.

[1-2] Operation of Semiconductor Memory Device 1

The semiconductor memory device 1 according to the first embodiment executes a kick operation in a read operation. The kick operation is an operation in which a voltage lower or higher than a target voltage is temporarily applied before application of the target voltage to a predetermined interconnect. The kick operation is executed, for example, for each of a signal line CG, control signals BLX and BLC, and a source line CELSRC, as a target. In the following descriptions, a voltage applied before the application of a target voltage in a kick operation is referred to as a "kick voltage", and the difference between the kick voltage and the target voltage is referred to as a "kick amount". An operation for applying a kick voltage lower than a target voltage, i.e., a kick operation in which the kick amount is a negative value is referred to as "negative kick". An operation for applying a kick voltage higher than the target voltage, i.e., a kick operation in which the kick amount is a positive value is referred to as "positive kick". A period in which a kick operation is executed is referred to as a "kick period".

For example, when a kick operation is executed for a signal line CG as a target, the voltage at the far end of the word line WL reaches the target voltage value earlier than in the case where the kick operation of the signal line CG is not executed. "A kick operation is executed for the signal line CG" has the same meaning as "a kick operation is executed for a word line WL". Therefore, in the present specification, a kick operation of a signal line CG is also referred to as a "kick operation of a word line WL".

When the positive kick is executed for the control signal BLC as a target, the amount of current supplied from the sense amplifier unit SAU to the bit line BL increases. When the negative kick is executed for the control signal BLC as a target, the amount of current supplied from the sense amplifier unit SAU to the bit line BL decreases. "A kick operation is executed for the control signal BLC" has the same meaning as "a kick operation is executed for a bit line BL". Therefore, in the present specification, a kick operation of the control signal BLC is also referred to as a "kick operation of a bit line BL".

When the positive kick is executed for the source line CELSRC as a target, it becomes difficult for a memory cell transistor MT to be turned on, and the discharge from the bit line BL to the source line CELSRC is suppressed. When the negative kick is executed for the source line CELSRC as a target, a memory cell transistor MT becomes easily turned on, and the discharge from a bit line BL to the source line CELSRC is expedited.

FIG. 13 illustrates an example of settings of kick operations in a read operation of the semiconductor memory device 1 according to the first embodiment, and specifically, illustrates setting examples for each of the control signal BLX, control signal BLC and the source line CELSRC. As illustrated in FIG. 13, for example, read voltages are categorized into three groups, and a different kick operation setting is used for each group. In the drawings referred to in the following descriptions, "NEG" corresponds to negative kick, and "POS" corresponds to positive kick.

In the first embodiment, when a read voltage for a first group is used, the negative kick is executed, for example, for each of the control signals BLX and BLC and the source line CELSRC. When a read voltage for a second group is used, the positive kick is executed for each of the control signals BLX and BLC, and the negative kick is executed for the source line CELSRC, for example. When a read voltage for a third group is used, the positive kick is executed, for example, for each of the control signals BLX and BLC and the source line CELSRC.

Figure 14:
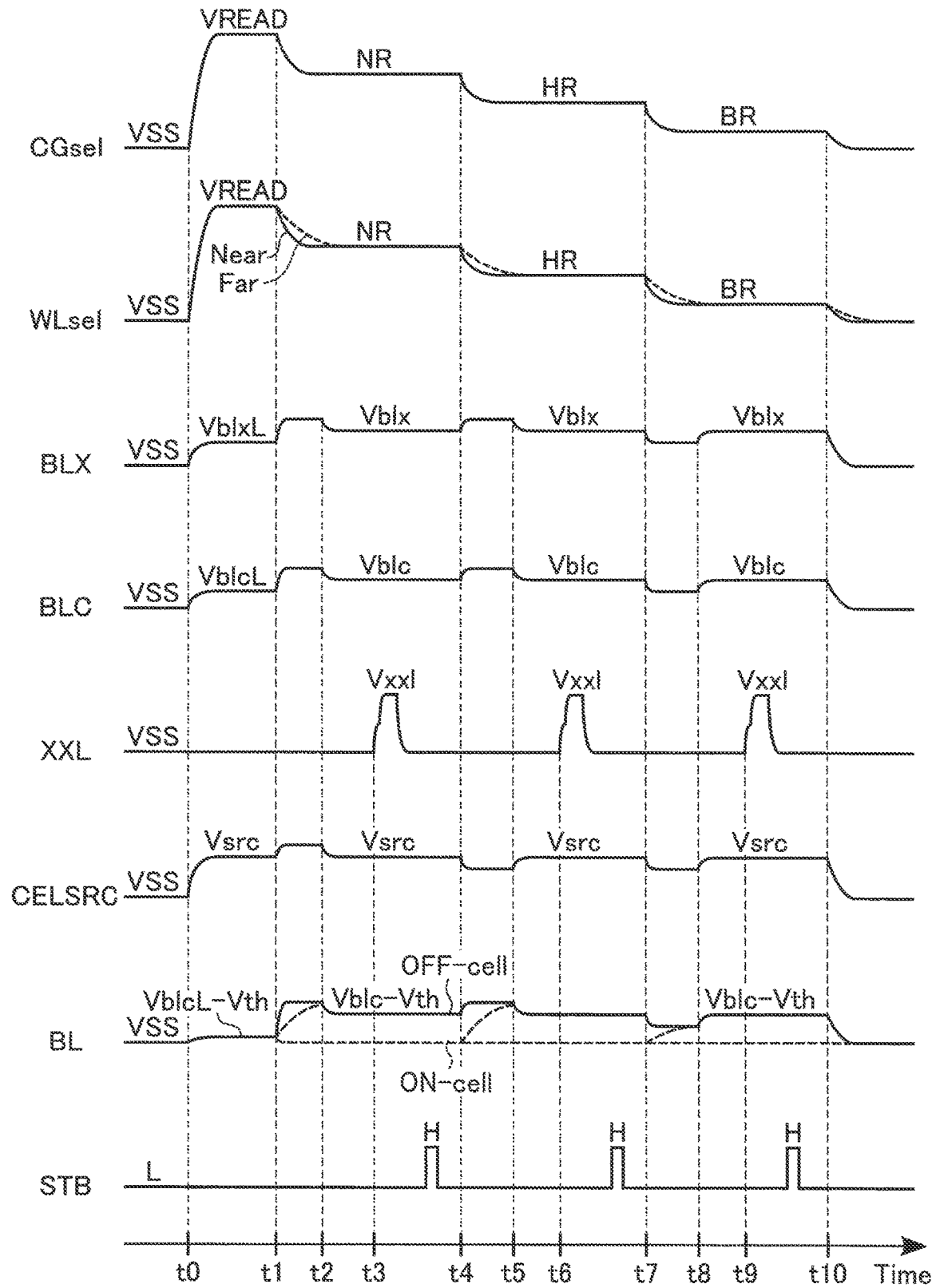
FIG. 14 is a timing chart illustrating an example of the read operation in the semiconductor memory device according to the first embodiment.

Hereinafter, specific examples of a read operation of the semiconductor memory device 1 according to the first embodiment will be described, with use of a read operation of upper page data as a typical example. FIG. 14 illustrates an example of a timing chart in the read operation of the upper page data in the semiconductor memory device according to the first embodiment. In this example, it is assumed that read voltages BR, HR, and NR used for the read operation of upper page data correspond to the first, second, and third groups, respectively.

In the following descriptions, voltages to be applied to various interconnects are suitably denoted by only reference signs. A memory cell transistor MT included in a cell unit CU to be read is referred to as a "selected memory cell". A word line WL coupled to the selected memory cell is referred to as a "selected word line WLsel". A signal CG coupled to the selected word line WLsel is referred to as a "selected signal line CGsel". In the read operation, a voltage generated by the driver module 14 is applied to the selected signal line CGsel via the row decoder module 15, and a voltage generated by the driver module 14 is applied to the source line CELSRC. It is assumed that the node SEN is suitably charged in a period in which various read voltages are applied thereto.

Furthermore, the voltage of the bit line BL illustrated in the timing chart referred to in the following descriptions shows that a voltage based on said voltage is applied to the bit line BL. For example, a voltage clamped by transistors 21 and 24 is applied to the bit line BL. It is assumed that the voltage of the node SINV in the sense amplifier unit SAU for which no read data is determined is set to "L" level. That is, inside the sense amplifier unit SAU for which no read data is determined, a transistor 20 is in the ON state and a transistor 25 is in the OFF state.

As illustrated in FIG. 14, at the start of the read operation, respective voltages for the selected signal line CGsel, selected word line WLsel, control signals BLX, BLC, and XXL, source line CELSRC, and bit line BL are, for example, ground voltages VSS. The voltage of the control signal STB has the "L" level, for example. In the read operation, the sequencer 13 executes an operation for removing residual electrons inside channels in a period from time t0 to t1, executes reading processing using the read voltage NR in a period time t1 to t4, executes read processing using the read voltage HR in a period time t4 to t7, and executes read processing using the read voltage BR in a period time t7 to t10. Hereinafter, details of these operations will be described.

At time t0, a read pass voltage VREAD is applied to the selected signal line CGsel, and a voltage Vsrc is applied to the source line CELSRC. When VREAD is applied to the selected signal line CGsel, the voltage of the selected word line WLsel is increased based on the voltage applied to the selected signal line CGsel. Specifically, for example, a voltage ("Near" in FIG. 14) at the near end of the selected word line WLsel increases up to the VREAD in the same manner as the selected signal line CGsel, and a voltage ("Far" in FIG. 14) at the far end of the selected word line WLsel increases up to the VREAD later than the selected signal line CGsel. The VREAD is also applied to non-selected word lines WL at time t0 (not shown), and the voltage changes in the same manner as the selected word line WLsel.

At time t0, the sequencer 13 raises, for example, the voltage of the control signal BLX from VSS to VblxL and raises the voltage of the control signal BLC from VSS to VblcL. The voltage value of VblcL is, for example, lower than VblxL. The voltage of the bit line BL then increases from VSS to VblcL-Vth based on the voltage of the control signal BLC and the threshold voltage Vth of the transistor 24. In the present specification, the voltage of the bit line BL during a read operation is described with disregard for a voltage drop, etc. due to a transistor 29. The actual voltage of the bit line BL is lower than the VblcL-Vth. When the voltage of selected and non-selected word lines WL increases to VREAD and the voltage of the control signal BLC increases to the VblcL, all of the transistors in the NAND string NS move to the ON state, and residual electrons inside the channel of the NAND string NS are removed.

Next, the read voltage NR is applied to the selected signal line CGsel at time t1. In response to this, the voltage of the selected word line WLsel drops based on the voltage applied to the selected signal line CGsel. Specifically, for example, the voltage of the near end portion of the selected word line WLsel drops to the read voltage NR similarly to the selected signal line CGsel. On the other hand, the voltage of the far end portion of the selected word line WLsel drops to the read voltage NR later than the selected signal line CGsel.

The sequencer 13 executes, at time t1, a kick operation targeted for the control signals BLX and BLC and the source line CELSRC. Specifically, the positive kick is executed for each of the control signals BLX and BLC and the source line CELSRC, and a kick voltage set for each interconnect is applied thereto. In response to this, the voltage of the bit line BL changes based on a result of the kick operation. The application of the kick voltage corresponding to the time t1 ends at time t2, for example.

After time t2, the voltage of the control signal BLX drops to Vblx, the voltage of the control signal BLC drops to Vblc, and the voltage of the source line CELSRC drops to Vsrc. The voltage value of Vblc is lower than Vblx, for example. During the time the read voltage NR is applied to the selected word line WLsel, the voltage of the bit line BL changes in accordance with the state of the selected memory cell. Specifically, when the selected memory cell is the ON state, the voltage of the bit line BL coupled to the memory cell drops ("ON-cell" in FIG. 14). When the memory cell is in the OFF state, the bit line BL coupled to the memory cell maintains a voltage based on the Vblc-Vth ("OFF-cell" in FIG. 14).

Next, the sequencer 13 raises the voltage of the control signal XXL from VSS to Vxx1 at time t3. When the voltage of the control signal XXL increases, a transistor 23 becomes in the ON state, the voltage of the node SEN changes in accordance with the voltage of the bit line BL. After the voltage of the bit line BL is reflected in the node SEN, the sequencer 13 decreases the voltage of the control signal XXL from Vxx1 to VSS. The voltage of the control signal XXL drops to VSS, the transistor 23 becomes in the OFF state, and the voltage of the node SEN is fixed. After that, the sequencer 13 asserts the control signal STB and determines data to be stored in the selected memory cell. Specifically, the sense amplifier unit SAU determines whether or not the threshold voltage of the selected memory cell is equal to or higher than the read voltage NR, and holds a result of the determination in the internally located latch circuit.

Next, the read voltage HR is applied to the selected signal line CGsel at time t4. In response to this, the voltage of the selected word line WLsel drops based on the voltage applied to the selected signal line CGsel. Specifically, for example, the voltage of the near end of the selected word line WLsel drops to the read voltage NR similarly to the selected signal line CGsel. On the other hand, the voltage of the far end of the selected word line WLsel drops to the read voltage HR later than the selected signal line CGsel.

Furthermore, the sequencer 13 executes a kick operation targeted for the control signals BLX and BLC and the source line CELSRC at time t4. Specifically, the positive kick is executed for the control signals BLX and BLC, the negative kick is executed for the source line CELSRC, and the voltage of the bit line BL changes based on the result of the kick operation. Specifically, the voltage of the bit line BL coupled to the selected memory cell whose state has changed from the ON state to the OFF state in accordance with the change in voltage of the selected word line WLsel increases up to Vblc-Vth. The application of the kick voltage corresponding to time t4 ends at time t5, for example.

After time t5, the voltage of the control signal BLX drops to Vblx, the voltage of the control signal BLC drops to Vblc, and the voltage of the source line CELSRC increases to Vsrc. During the time the read voltage HR is applied to the selected word line WLsel, the voltage of the bit line BL changes in accordance with the state of the selected memory cell. This change in voltage of the bit line BL is the same as that described for the read processing using the read voltage NR at time t2. The description on the operation at the subsequent time t6 is also omitted since it is the same as that of the operation at time t3. Whether or not the threshold voltage of the selected memory cell is equal to or higher than the read voltage HR is determined through the operation at time t6, and a result of the determination is held in the latch circuit inside the sense amplifier unit SAU.

Next, at time t7, the read voltage BR is applied to the selected signal line CGsel. In response to this, the voltage of the selected word line WLsel drops based on the voltage applied to the selected signal line CGsel. Specifically, for example, the voltage of the near end portion of the selected word line WLsel drops to the read voltage BR similarly to the selected signal line CGsel. On the other hand, the voltage of the far end portion of the selected word line WLsel drops to the read voltage BR later than the selected signal line CGsel.

The sequencer 13 executes a kick operation targeted for the control signals BLX and BLC and the source line CELSRC at time t7. Specifically, the negative kick is executed for each of the control signals BLX and BLC and the source line CELSRC, and the voltage of the bit line BL changes based on a result of the kick operation. Specifically, the voltage of the bit line BL coupled to the selected memory cell whose state has changed from the ON state to the OFF state increases up to Vblc-Vth. The application of the kick voltage corresponding to time t7 ends at time t8, for example.

After time t8, the voltage of the control signal BLX increases to Vblx, the voltage of the control signal BLC increases to Vblc, and the voltage of the source line CELSRC increases to Vsrc. During the time the read voltage BR is applied to the selected word line WLsel, the voltage of the bit line BL changes in accordance with the state of the selected memory cell. This change in voltage of the bit line BL is the same as that described for the read processing using the read voltage NR at time t2. The description on the operation at the subsequent time t9 is also omitted since it is the same as that of the operation at time t3. Whether or not the threshold voltage of the selected memory cell is equal to or higher than the read voltage BR is determined through the operation at time t9, and a result of the determination is held in the latch circuit inside the sense amplifier unit SAU.

Next, the sequencer 13 determines the upper page data at time t10, based on the data held in the latch circuit in each sense amplifier unit SAU. The sequencer 13 then returns the respective voltages of the selected signal line CGsel, the control signals BLX, BLC, and XXL, and the source line CELSRC to the states anterior to the read operation, and ends the read operation.

As described above, the semiconductor memory device 1 according to the first embodiment can execute the read operation of upper page data. The semiconductor memory device 1 according to the first embodiment can suitably execute a kick operation in accordance with the group allocation shown in FIG. 13, similarly to the read operation of upper page data.

[1-3] Advantageous Effects of First Embodiment

According to the semiconductor memory device 1 of the above-described embodiment, it is possible to speed up the read operation of the semiconductor memory device 1. Hereinafter, detailed advantageous effects of the semiconductor memory device 1 according to the first embodiment will be described.

The semiconductor memory device can have a structure where memory cells are three-dimensionally stacked and realize a large capacity by forming memory pillars MP penetrating through stacked word lines WL. For example, the stacked word lines WL are drawn in the shape of a staircase at the end of a memory cell array. Voltages are applied to the word lines WL via contacts coupled to terrace portions in the staircase formed.

However, since the word lines WL have values of resistance, the influence of the RC delay might not be disregarded according to the positional relationship between a word line WL and a memory pillar MP. Specifically, when the voltage applied from the driver module 14 to the signal line CG changes, the change rate of the voltage of a word line WL relative to the change rate of the voltage of the signal line CG varies between a region electrically near the driver module 14 and a region electrically far from the driver module 14. In other words, the change rate of the voltage varies between a region near the contact CC in the word line WL and a region far from the contact CC in the word line WL. Therefore, it is assumed that the voltage of the word line WL at its far end reaches a target voltage later than the voltage of the word line WL at its near end.

For example, when the read timing is expedited without preparing sufficient time for stabilizing the voltage of the word line WL at its far end, read errors may be increased. On the other hand, when the read timing is set in line with the time required for stabilizing the voltage of the word line WL at its far end, the read time is likely to be longer. That is, in the read operation, the operational timing is preferably determined in consideration of the time until the voltage of the word line WL at its far end is stabilized.

In addition, in the case where various kinds of read voltages are used in the read operation of the semiconductor memory device, a method is known in which data is read in the order from higher states to lower states. When the voltages of the selected word line WLsel are shifted from a higher state to a lower state, the voltage of the word line WL at its near end drops soon; however, the drop in voltage at the far end of the word line WL is delayed. For this reason, over-discharge is likely to take place in the bit line BL coupled to the NAND string NS located at a far end portion of the word line WL, and the time required for stabilizing the voltage of the bit line BL is likely to be longer.

As a countermeasure against the over-discharge of bit line BL, the charge of the bit line BL at which the overcharge has occurred, through execution of a kick operation of the bit line BL, may be considered. This countermeasure supplements the charge to the bit line BL in which the over-discharge has occurred, and can stabilize the voltage of the bit line BL in a short time. However, a kick operation of a bit line BL could cause noise of the bit line BL, increasing read errors.

Furthermore, as a countermeasure against the over-discharge of a bit line BL, the charging of the bit line BL in which the over-discharge has occurred, through a kick operation of the source line CELSRC, may also be considered. However, the kick operation of the source line CELSRC has a greater operation load than that in the kick operation of a bit line BL.

The kick operation described above can exert a different advantageous effect through an alteration of the kick direction of the voltage. Herein, as described above, the kick operation has both advantages and side effects, and is thus preferably executed with consideration given to the balance between the improvement effects and side effects.

Figure 15:
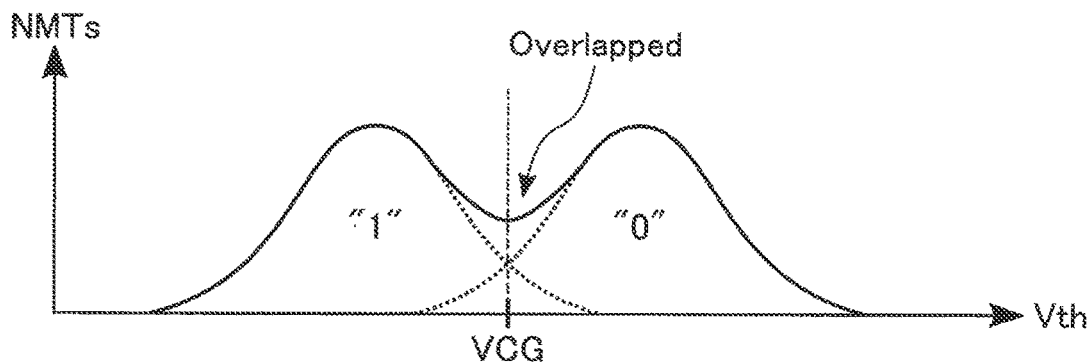
FIG. 15 is a threshold voltage distribution diagram illustrating an example of a fail bit between two adjacent states in the semiconductor memory device according to the first embodiment.
Figure 15:
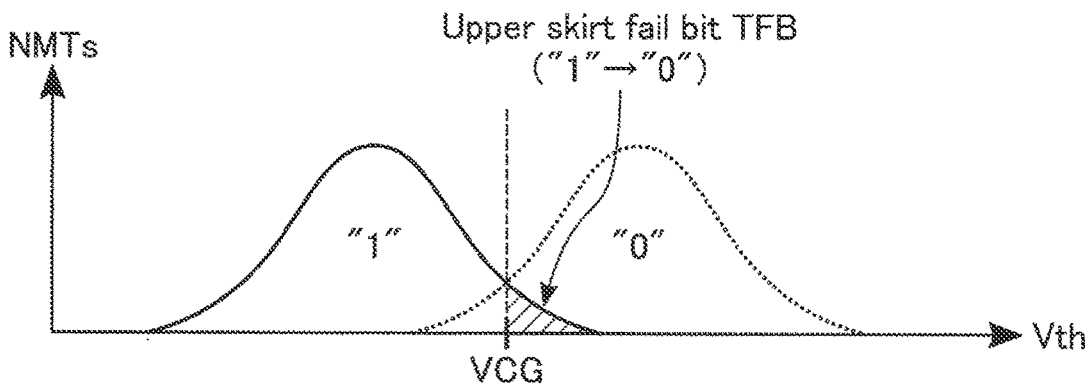
Figure 15:
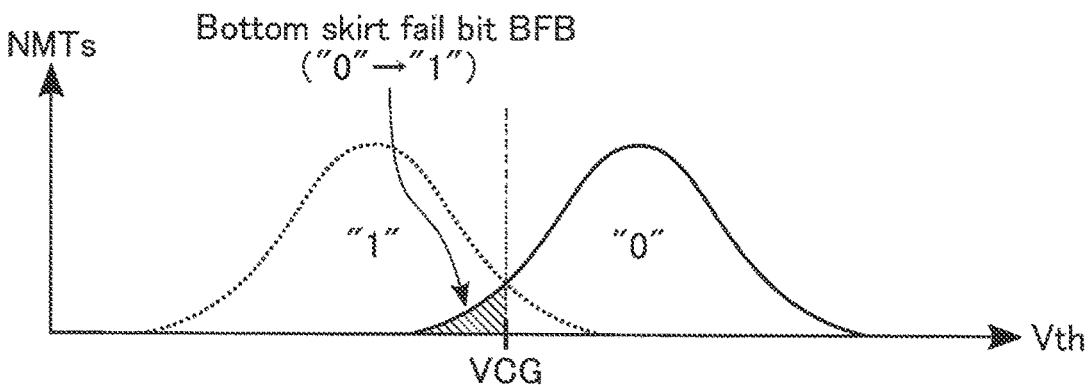

Here, the kinds of fail bits (error-read data) in the semiconductor memory device 1 will be described using FIG. 15. FIG. 15 illustrates an example of fail bits between two adjacent states, in the semiconductor memory device 1 according to the first embodiment. In the threshold voltage distribution illustrated in FIG. 15, the ordinate corresponds to the number (NMTs) of memory cell transistors MT, and the abscissa corresponds to threshold voltages Vth of the memory cell transistors MT. One of the two states illustrated in FIG. 15 corresponds to "1" data, and the other corresponds to "0" data. VCG indicates a read voltage set between the state of "1" data and the state of "0" data.

As illustrated in FIG. 15(a), an overlapped portion may be formed between the two adjacent states. In FIG. 15(a), the state of data is illustrated in a manner where the overlapped portion between the two adjacent states is added. On the other hand, in FIGS. 15(B) and 15(c), the state of data is illustrated in a manner where the overlapped portion between the two adjacent states is illustrated independently, a state corresponding to "1" data or "0" data is shown by a solid line, and the other state is shown by a broken line.

As illustrated in FIG. 15(b), in the state corresponding to "1" data, data of a memory cell transistor MT where the threshold voltage is equal to or higher than the read voltage VCG corresponds to a fail bit. In the fail bit, it is detected that the data is changed from "1" data to "0" data, and is then corrected to "1" data through error correction processing.

As illustrated in FIG. 15(c), in the state corresponding to "0" data, data of a memory cell transistor MT where the threshold voltage is lower than the read voltage VCG becomes a fail bit. When a change from "0" data to "1" data in the fail bit is detected, this data is corrected to "0" data through error correction processing.

The definitions of data between the two adjacent states illustrated in FIG. 15 may be exchanged. In the following descriptions, a fail bit generated at the top skirt of a state where the threshold voltage is lower, out of the two adjacent states, is referred to as a "top skirt fail bit TFB", and a fail bit generated at the bottom skirt of a state where the threshold voltage is higher, out of the two adjacent states, is referred to as a "bottom skirt fail bit BFB". The number of the top skirt fail bits TFB is referred to as a "top skirt fail bit count TFBC", and the number of bottom skirt fail bits BFB is referred to as a "bottom skirt fail bit count BFBC".

A kick operation effective for top skirt fail bits TFB differs from a kick operation effective for bottom skirt fail bits BFB. For example, when the negative kick of bit line BL and/or the negative kick of the source line CELSRC is executed, the charge of the bit line BL is suppressed, and the top skirt fail bit count TFBC is suppressed. On the other hand, when the positive kick of bit line BL and/or the positive kick of the source line CELSRC is executed, the charge of the bit line BL is facilitated and the bottom skirt fail bit count BFBC is suppressed.

In general, the kick operation for suppressing the top skirt fail bit count TFBC has a side effect of increasing the bottom skirt fail bit count BFBC. Similarly, the kick operation for suppressing the bottom skirt fail bit count BFBC has a side effect of increasing the top skirt fail bit count TFBC. However, the threshold voltage distribution shape differs in accordance with the state, i.e. whether it is the low-threshold-voltage state (such as "A" state) or the high-threshold-voltage state (such as "0" state). Therefore, in the situation where the TFBC is dominant as compared with the BFBC, the kick operation for suppressing the TFBC may have a more advantageous effect as compared with the side effect of increasing the BFBC. Similarly, in the situation where the BFBC is dominant as compared with the TFBC, the kick operation for suppressing the BFBC may have a more advantageous effect as compared with the side effect of increasing the TFBC.

For this reason, the balance between the top skirt fail bit count TFBC and the bottom skirt fail bit count BFBC can be adjusted by a kick operation of the bit line BL and a kick operation of the source line CELSRC. If one of TFBC and BFBC is dominant as compared with the other, the resulting total fail bit count FBC can be suppressed by adjusting the balance between them.

Figures 16, 17:
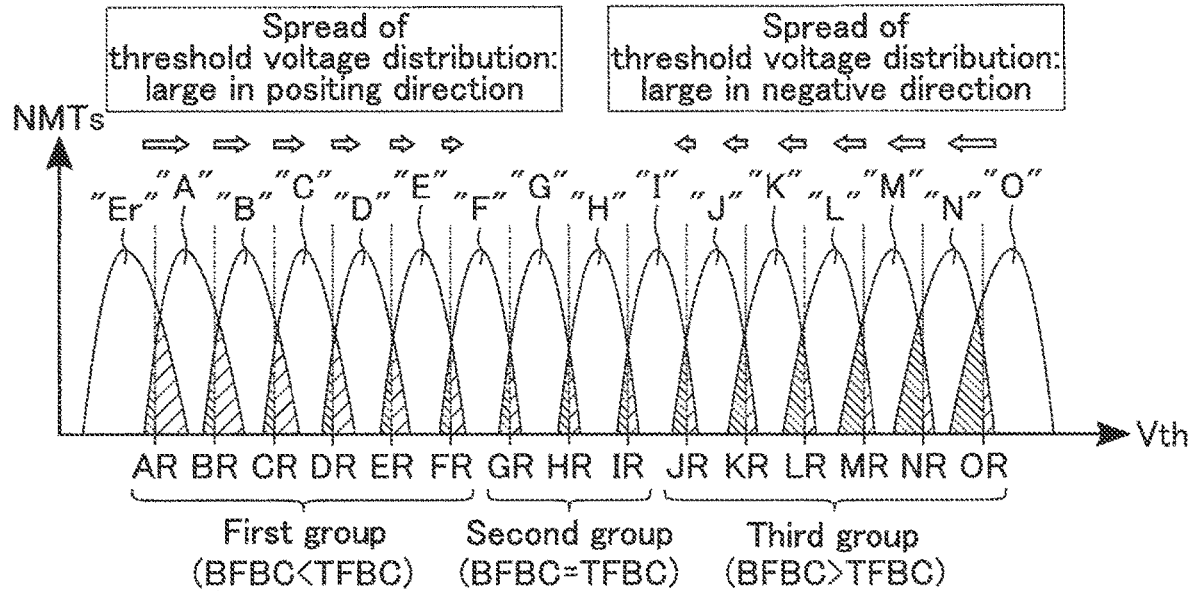
FIG. 16 is a threshold voltage distribution diagram illustrating an example of distributions of threshold voltages of memory cell transistors in the semiconductor memory device according to the first embodiment.
FIG. 17 is a table illustrating an example of the settings of kick operations in a read operation of a semiconductor memory device according to a second embodiment.

FIG. 16 illustrates an example of threshold voltage distributions of memory cell transistors MT in the case where data is stored through the QLC scheme. As illustrated in FIG. 16, in the 16 states of threshold voltage distributions in the QLC scheme, the threshold voltage distribution shapes differ between lower-threshold-voltage states and higher-threshold-voltage states. Specifically, for example, the lower-threshold-voltage states tend to have the threshold voltage distribution shapes of spreading toward the positive direction. Namely, the threshold voltage distribution shapes of the lower-threshold-voltage states have the large top skirts. On the other hand, the higher-threshold-voltage states tend to have the threshold voltage distribution shapes of spreading toward the negative direction. Namely, the threshold voltage distribution shapes of the higher-threshold-voltage states have the large bottom skirts. The spreading amounts of the bottom skirt and the top skirt generally became smaller as the positions of the states become closer to a medium threshold voltage.

The 16 states of threshold voltage distributions in the QLC scheme are categorized into, for example, three groups, i.e., a group in which the spread of the top skirt is large (hereinafter, referred to as a "first group"), a group in which the spreads of the top and bottom skirts are small (hereinafter, referred to as a "second group"), and a group in which the spread of the bottom skirt is large (hereinafter, referred to as a "third group"). In the first group, the top skirt fail bit count TFBC tends to be greater than the bottom skirt fail bit count BFBC. In the second group, the bottom skirt fail bit count BFBC and the top skirt fail bit count TFBC tend to be substantially equal to each other. In the third group, the bottom skirt fail bit count BFBC tends to be greater than the top skirt fail bit count TFBC.

In view of the tendencies, the semiconductor memory device 1 according to the first embodiment changes, in a read operation, the setting of a kick operation for each read voltage. In other words, the setting of a kick operation is optimized according to the shape of the threshold voltage distribution, i.e., whether the TFBC due to the top skirt or the BFBC due to the bottom skirt is dominant and therefore is to be preferentially suppressed.

Specifically, in the semiconductor memory device 1 according to the first embodiment, for example, when a read voltage corresponding to the first group is used, the top skirt fail bit count TFBC is suppressed by the negative kick of the bit line BL and the negative kick of the source line CELSRC. When a read voltage corresponding to the third group is used, the bottom skirt fail bit count BFBC is suppressed by the positive kick of the bit line BL and the positive kick of the source line CELSRC. In this way, in the read operation of the semiconductor memory device 1 according to the first embodiment, an optimum kick operation is selected on a state basis, and there exists a case where the positive kick and the negative kick of the bit line BL are present in a mixed manner, and the positive kick and the negative kick of the source line CELSRC are present in a mixed manner.

As a result, the semiconductor memory device 1 according to the first embodiment can execute a kick operation of a word line WL and balance between the top skirt fail bit count TFBC and the bottom skirt fail bit count BFBC. In other words, the semiconductor memory device 1 according to the first embodiment can suppress the fail bit count FBC while suppressing the influence of the RC delay of word line WL. Therefore, the semiconductor memory device 1 according to the first embodiment can speed up a read operation and improve the reliability of read data.

In the read operation of the semiconductor memory device 1 according to the first embodiment, an example of a case is described in which in the event a read voltage corresponding to the second group is used, the positive kick of the bit line BL and the negative kick of the source line CELSRC are executed. In this case, in the bit line BL, it is possible to obtain, for example, an effect in which the effect of the positive kick of the bit line BL and the effect of the negative kick of the source line CELSRC are offset by one another. This effect is the same as, for example, an effect in which both kick operations of the bit line BL and the source line CELSRC are omitted. The negative kick of the bit line BL and the positive kick of the source line CELSRC may be used in combination. Also, in this case, it is possible to obtain the same effect as that in the case where both kick operations of the bit line BL and the source line CELSRC are omitted.

[2] Second Embodiment

The semiconductor memory device 1 according to the second embodiment has the same configuration as that of the first embodiment and executes a read operation in which the order of application of read voltages differs from that of the first embodiment. Hereinafter, points of the semiconductor memory device 1 according to a second embodiment different from the first embodiment will be described.

[2-1] Operation of Semiconductor Memory Device 1

FIG. 17 illustrates an example of the setting of a kick operation in the read operation of the semiconductor memory device 1 according to the second embodiment, and further illustrates setting examples of kick operations for each of the control signal BLX, the control signal BLC, and the source line CELSRC. As illustrated in FIG. 17, in the second embodiment, when a read voltage of the second group is used, kick operations for the respective control signals BLX and BLC are omitted, and the negative kick is executed for the source line CELSRC. The other settings are the same as those in FIG. 13 described in the first embodiment.

Figure 18:
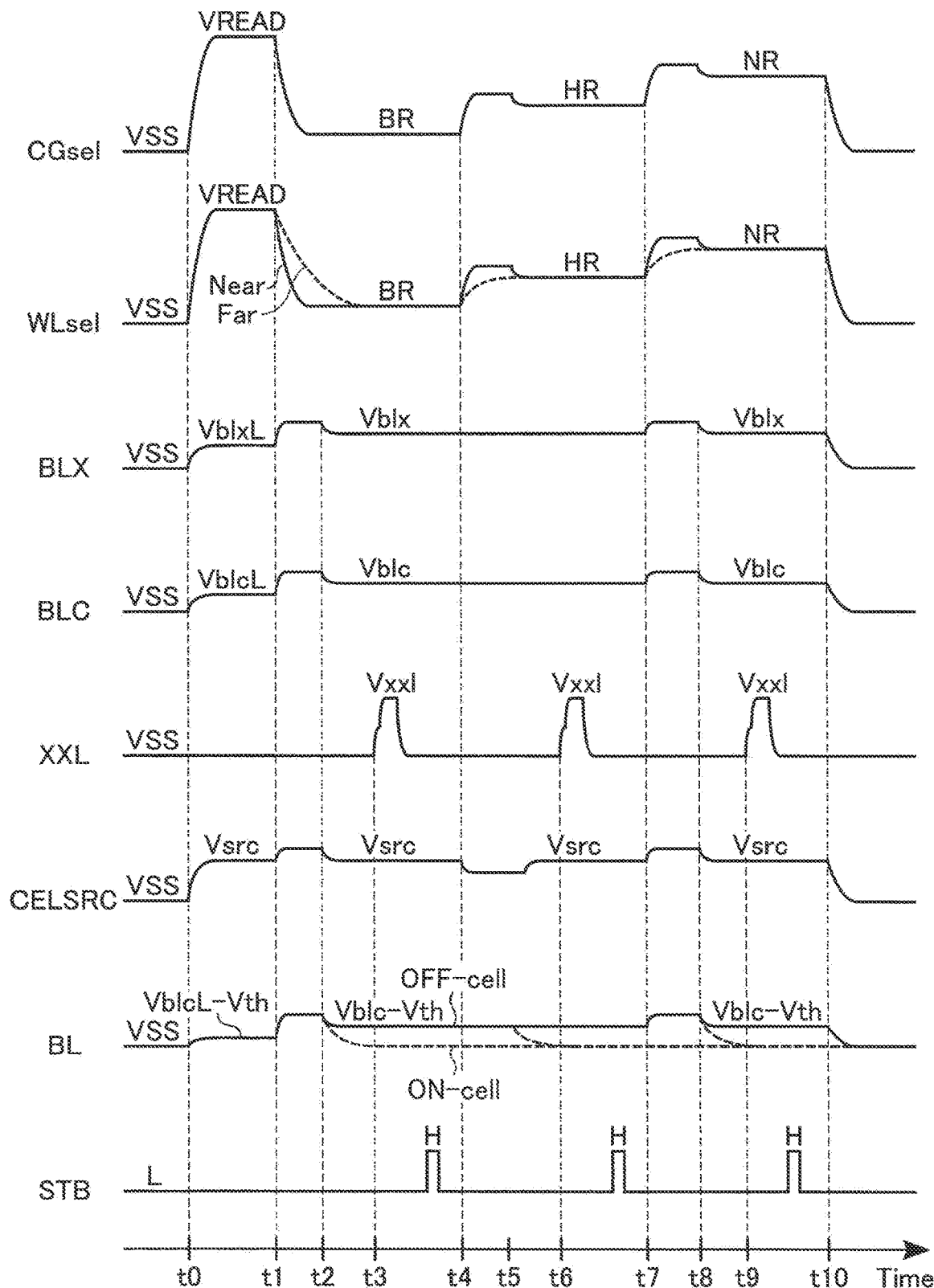
FIG. 18 is a timing chart illustrating an example of a read operation in the semiconductor memory device according to the second embodiment.

Hereinafter, a specific example of the read operation of the semiconductor memory device 1 according to the second embodiment will be described, using a read operation of upper page data as a typical example. FIG. 18 illustrates an example of a timing chart in the read operation of upper page data, in the semiconductor memory device according to the second embodiment. In this example, it is assumed that the read voltages BR, HR, and NR used in the read operation of the upper page data correspond to the third, second, and third groups, respectively.

In the read operation of the semiconductor memory device 1 according to the second embodiment, the read voltage BR corresponding to a state with a lower threshold voltage corresponds to the third group, unlike in the first embodiment. A model corresponding to this group allocation will be described in the subsequent third embodiment.

As illustrated in FIG. 18, in the read operation, the sequencer 13 executes: an operation for removing residual electrons in the channel in a period, for example, time t0 to time t1; read processing using the read voltage BR in a period time t1 to time t4; read processing using the read voltage HR in a period time t4 to time t7; and read processing using the read voltage NR in a period time t7 to time t10. That is, in the read operation in the second embodiment, read voltages are applied in the reverse order of that in the first embodiment.

The descriptions on the operation in the period time t0 to t1 are omitted since they are the same as those during time t0 to t1 in FIG. 14.

At time t1, the read voltage BR is applied to a selected signal line CGsel. As a result, the voltage of the selected word line WLsel at its near end drops to the read voltage BR in the same manner, for example, as the selected signal line CGsel; and the voltage of the selected word line WLsel at its far end drops to the read voltage BR later than the selected signal line CGsel, similarly to the first embodiment.

The sequencer 13 executes a kick operation targeted at the control signals BLX and BLC and the source line CELSRC at time t1. Specifically, the positive kick is executed for each of the control signals BLX and BLC and the source line CELSRC, and a kick voltage set for each interconnect is applied thereto. As a result, the voltage of the bit line BL changes based on a result of the kick operation. The application of the kick voltage corresponding to the time t1 ends at time t2, for example.

After time t2, the voltage of the control signal BLX drops to Vblx, the voltage of the control signal BLC drops to Vblc, and the voltage of the source line CELSRC drops to Vsrc. During the time the read voltage BR is applied to the selected word line WLsel, the voltage of the bit line BL changes in accordance with the state of the selected memory cell. The change in the voltage of the bit line BL is the same as that described in the read processing using the voltage NR at time t2 described in FIG. 14. The description on the operation at the subsequent time t3 is also omitted since it is the same as that of the operation at the time t3 in FIG. 14. Whether or not the threshold voltage of a selected memory cell is equal to or higher than the read voltage BR is determined through the operation at time t3, and a result of the determination is held in the latch circuit internally located in the sense amplifier unit SAU.

Next, at time t4, a kick operation is used for the selected signal line CGsel, and the voltage HR is applied thereto. Specifically, the sequencer 13 temporarily applies a kick voltage higher than the read voltage HR to the selected word line WLsel before the application of the read voltage HR. As a result, the voltage of the near end portion of the selected word line WLsel drops to the read voltage HR after the application of the kick voltage, for example, similarly to the selected signal line WLsel. The voltage of the far end portion of the selected word line WLsel increases to the read voltage HR, for example, without exceeding the read voltage HR.

At time t4, the sequencer 13 omits the kick operation targeted for the control signals BLX and BLC and executes a kick operation targeted for the source line CELSRC. Specifically, during a period of time t4 and t5, the voltage of the control signal BLX is maintained at Vblx, the voltage of the control signal BLC is maintained at Vblc, the negative kick is executed for the source line CELSRC, and the voltage of the bit line BL changes based on a result of the kick operation. The application of the kick voltage corresponding to time t4 ends at time t5, for example.

After the time t5, the voltage of the source line CELSRC increases to Vsrc. During the time in which the read voltage HR is applied to the selected word line WLsel, the voltage of the bit line BL changes in accordance with the state of the selected memory cell. This change in voltage of the bit line BL is the same as that described for the read processing using the read voltage NR at time t2. In addition, the description of the operation at the subsequent time t6 is also be omitted since it is the same as that of the operation at time t3. Whether or not the threshold voltage of the selected memory cell is equal to or higher than the read voltage HR is determined through the operation at time t6, and a result of the determination is held in the latch circuit inside the sense amplifier unit SAU.

Next, a kick operation is used for the selected signal line CGsel, and the read voltage NR is applied thereto at time t7. Specifically, the sequencer 13 temporarily applies a kick voltage higher than the read voltage NR before the application of the read voltage NR. As a result, the voltage of the near end portion of the selected word line WLsel drops to the read voltage NR after the application of the kick voltage, for example, similarly to the selected signal line CGsel. The voltage of the far end portion of the selected word line WLsel increases to the read voltage NR, for example, without exceeding the read voltage NR.

At time t7, the sequencer 13 executes a kick operation targeted for the control signals BLX and BLC and the source line CELSRC. Specifically, the positive kick is executed for each of the control signals BLX and BLC, and the source line CELSRC, and the voltage of the bit line BL changes based on a result of the kick operation. The application of the kick voltage corresponding to time t7 ends at time t8, for example.

After time t8, the voltage of the control signal BLX drops to Vblx, the voltage of the control signal BLC drops to Vblc, and the voltage of the source line CELSRC drops to Vsrc. During the time the read voltage NR is applied to the selected word line WLsel, the voltage of the bit line BL changes in accordance with the state of the selected memory cell. This change in voltage of the bit line BL is the same as that described for the read processing using the read voltage NR at time t2. The description of the operation at the subsequent time t9 is also omitted since it is the same as that of the operation at time t3. Whether or not the threshold voltage of the selected memory cell is equal to or higher than the read voltage NR is determined through the operation at time t9, and a result of the determination is held in the latch circuit inside the sense amplifier unit SAU.

Next, the sequencer 13 fixes the upper page data at time t10, based on the data held in the latch circuit in each sense amplifier unit SAU. The sequencer 13 then returns the respective voltages of the selected signal line CGsel, the control signals BLX, BLC, and XXL, and the source line CELSRC to the states anterior to the read operation, before ending the read operation.

As described above, the semiconductor memory device 1 according to the second embodiment can execute the read operation of upper page data. The semiconductor memory device 1 according to the second embodiment can suitably execute a kick operation in accordance with the group allocation illustrated in FIG. 17, in the respective read operations of lower, middle, and upper pages, similarly to the read operation of upper page data.

[2-2] Advantageous Effects of Second Embodiment

In the read operation of the semiconductor memory device 1 according to the second embodiment, when various kinds of read voltages are used, read operations are executed in the order of lower states to higher states. The semiconductor memory device 1 according to the second embodiment executes a kick operation of a word line WL for assisting an increase in voltage at the far end of the word line WL. In this case, over-discharge is likely to take place in a bit line BL coupled to the NAND string NS located at a near end portion of the word line WL, and the time required for stabilizing the voltage of the bit line BL is likely to be longer.

In contrast, in the semiconductor memory device 1 according to the second embodiment, the setting of a kick operation for each read voltage is changed. With this configuration, the semiconductor memory device 1 according to the second embodiment can suppress the fail bit count FBC while suppressing the influence of the RC delay of word line WL, similarly to the first embodiment. That is, the semiconductor memory device 1 according to the second embodiment can speed up the read operation and improve the reliability of read data, similarly to the first embodiment.

In the read operation of the semiconductor memory device 1 according to the second embodiment, the read voltage BR corresponding to a state with a lower threshold voltage corresponds to the third group, unlike in the first embodiment. The model corresponding to this group allocation will be described in the subsequent third embodiment.

[3] Third Embodiment

The semiconductor memory device 1 according to a third embodiment has the same configuration as that of the first embodiment and executes the group allocation of kick operations, based on the amount of change in read voltage. Hereinafter, points of the semiconductor memory device 1 according to the third embodiment which differ from those of the first and second embodiments will be described.

[3-1] Setting of Kick Operation

Figure 19:
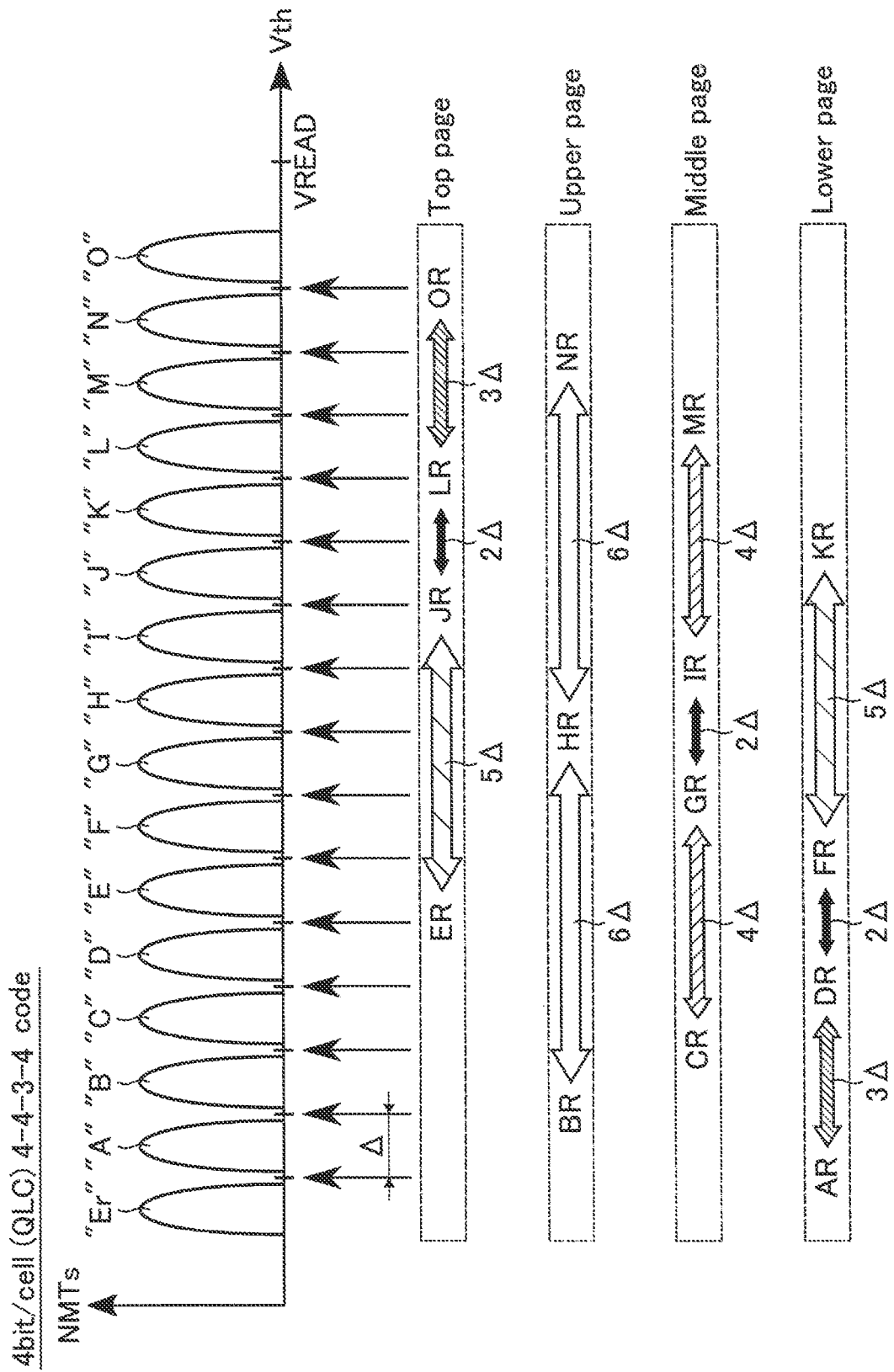
FIG. 19 is a threshold voltage distribution diagram illustrating an example of the settings of read voltages in a semiconductor memory device according to a third embodiment.

FIG. 19 illustrates an example of the settings of read voltages in the semiconductor memory device 1 according to the third embodiment, and corresponds to the "4-4-3-4 code". As illustrated in FIG. 19, there exist a plurality of variations of the amount of change in read voltage used in each of the read operations of the lower, middle, upper, and the top page data. In the following descriptions, the amount of change of the read operation in each page read operation will be described, assuming that the voltage between adjacent read voltages is denoted by "$\Delta$".

In the read operation of lower page data, the difference in voltage between read voltages AR and DR is $3\Delta$, the difference in voltage between read voltages DR and FR is $2\Delta$, and the difference in voltage between read voltages FR and KR is $5\Delta$. In the read operation of middle page data, the difference in voltage between read voltages CR and GR is $4\Delta$, the difference in voltage between read voltages GR and IR is $2\Delta$, and the difference in voltage between read voltages IR and MR is $4\Delta$. In the read operation of upper page data, the difference in voltage between read voltages BR and HR is $6\Delta$, and the difference in voltage between read voltages HR and NR is $6\Delta$. In the top page data read operation, the difference in voltage between read voltages ER and JR is $5\Delta$, the difference in voltage between read voltages JR and LR is $2\Delta$, and the difference in voltage between read voltages LR and OR is $3\Delta$.

In this way, in the present embodiment, there exist six kinds of amount of change of the read operation, including $2\Delta$, $3\Delta$, $4\Delta$, $5\Delta$, and $6\Delta$. In the semiconductor memory device 1 according to the third embodiment, the group allocation of read voltages is implemented based on the amounts of change (the transition amounts) of the read voltages.

Figures 20, 21:
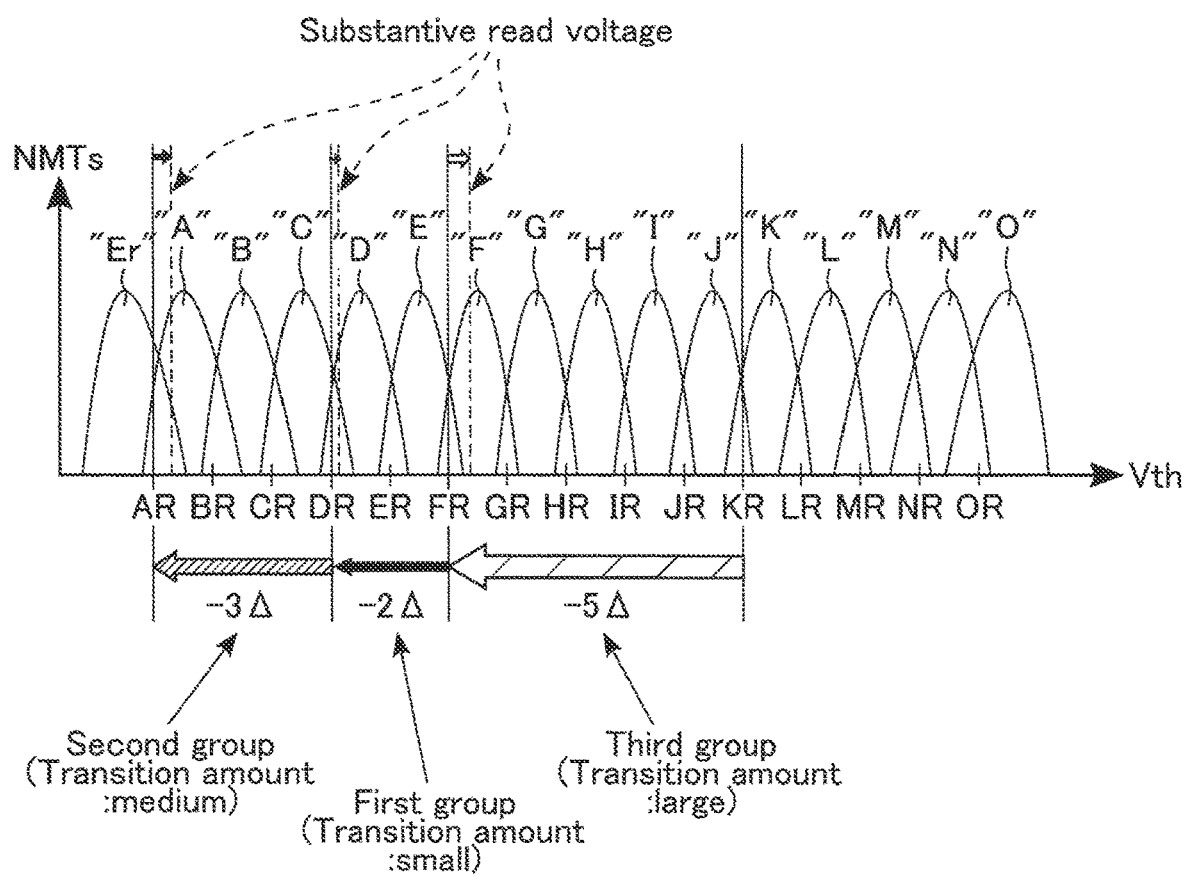
FIG. 20 is a table illustrating an example of kick operations in a read operation of the semiconductor memory device according to the third embodiment.
FIG. 21 is a threshold voltage distribution diagram illustrating examples of threshold voltages and substantive read voltages of memory cell transistors in the semiconductor memory device according to the third embodiment.

FIG. 20 illustrates an example of the settings of kick operations in the read operation of the semiconductor memory device 1 according to the third embodiment, and illustrates settings of kick operations for each of the control signal BLX, control signal BLC, and the source line CELSRC. As illustrated in FIG. 20, for example, read voltages are categorized into three groups based on the amounts of change of the read voltage, and a setting of a kick operation which differs on a group basis is used. The setting of the kick operation used for each group is the same as that in FIG. 13 described in the first embodiment.

A first group corresponds to read voltages in which the amount of change in read voltage is 1 to $2\Delta$, i.e., read voltages in which the transition amount of read voltage is small. A second group corresponds to read voltages in which the amount of change in read voltage is 3 to 4Δ, i.e., read voltages in which the transition amount of read voltage is around a medium level. A third group corresponds to read voltages in which the amount of change in read voltage is 5 to 6Δ, i.e., read voltages in which the transition amount of read voltage is large.

For example, in the case where the read voltages are applied in the order of higher read voltages (in the descending order) as shown in the first embodiment, the read voltage LR is applied with a drop of 3Δ from the read voltage OR, and is thus included in the second group. In contrast, in the case where read voltages are applied in the order of lower voltages (in the ascending order) as shown in the second embodiment, the read voltage LR is applied with an increase of 2Δ from the read voltage JR, and is thus included in the second group. The same applies to the other read voltages. The group of read voltages initially applied after the application of a read pass voltage VREAD is determined in accordance with, for example, a difference in voltage between VREAD and said read voltage.

[3-2] Advantageous Effects of Third Embodiment

In the read operation of the semiconductor memory device 1, there may be a case where the top skirt fail bit count TFBC and the bottom skirt fail bit count BFBC vary based on the transition amount and the transition direction of the read voltage. FIG. 21 illustrates an example of threshold voltage distributions of memory cell transistors MT in the case where data is stored in the QLC scheme, and also illustrates a change in read voltage in the upper page data read operation described in the first embodiment. As illustrated in FIG. 21, the upper page data read operation includes three kinds of transition amount of read voltage.

When a read voltage transfers from KR to FR, the read voltage varies astride five states ("F" to "J" states). When a read voltage transfers from FR to DR, the read voltage varies astride two states ("D" and "E" states). When a read voltage transfers from DR to AR, the read voltage varies astride three states ("A" to "C" states). That is, as the number of memory cell transistors MT transferring from the ON state to the OFF state is greater, the transition amount of the read voltage becomes larger.

In an actual read operation, however, the change in state of a memory cell transistor MT based on the change in voltage of a selected word line WLsel involves a delay. That is, as the number of memory cell transistors MT transferring from the ON state to the OFF state due to the transition of a read voltage becomes larger, the bottom skirt fail bit count BFBC is liable to be greater, and the substantive read voltage tends to increase.

In addition, when a high voltage is applied to a control gate of a memory cell transistor MT, for example, the trapping of electrons to the channel boundary face of the memory cell transistor or the bias of electrons inside the stacked charge storage layers may occur. In this case, the threshold voltage of the memory cell transistor MT appears to be increased, and the number of the top skirt fail bits TFB tends to be increased.

As described above, the top skirt fail bit count TFBC, the bottom skirt fail bit count BFBC, and the balance between TFBC and BFBC are likely to change based on the transition amount, etc. of the read voltage. Therefore, the semiconductor memory device 1 according to the third embodiment executes a group allocation of read voltages based on the transition amounts of read voltages.

For example, when the transition amount of read voltage is small, the top skirt fail bits TFB are more easily generated, and thus a kick operation corresponding to the first group (a group in which TFB is preferentially suppressed) is executed. When the transition amount of read voltage is around a medium level, the top skirt fail bit TFB and the bottom skirt fail bit BFB balance comparably.

Therefore, a kick operation corresponding to the second group (e.g., a group in which TFB and BFB are balanced) is executed. When the transition amount of read voltage is large, the bottom skirt fail bits BFB are easily generated. Therefore, a kick operation corresponding to the third group (a group in which BFB is preferentially suppressed) is executed.

As a result, the semiconductor memory device 1 according to the third embodiment can suppress the fail bit count FBC while suppressing the influence of the RC delay of word line WL. That is, the semiconductor memory device 1 according to the third embodiment can speed up a read operation and improve the reliability of read data, similarly to the first embodiment.

The above described mode of generation of fail bits is presented by way of example only. The bias between the top skirt fail bits TFB and the bottom skirt fail bits BFB may occur based on various phenomena. In the third embodiment, it suffices that the allocation of groups of kick operations is implemented based at least on the transition amounts of read voltages.

In addition, in the allocation of groups of kick operations, the amount of change in read voltage may overlap between groups. In this case, the first group corresponds to 1 to 3Δ, the second group corresponds to 3 to 5Δ, and the third group corresponds to 5 and 6Δ, for example. The overlapped portion is determined, for example, in accordance with the height of the state. For example, a state with a lower threshold voltage easily generates top skirt fail bits TFB, and is thus associated with a group having a larger effect of suppressing the top skirt. Since a state with a higher threshold voltage easily generates bottom skirt fail bits BFB, the state is associated with a group having a larger effect of suppressing the bottom skirt. In this way, by considering not only the transition amounts of read voltages but also the way the skirt spreads on a state basis, the semiconductor memory device 1 can highly accurately suppress the fail bit count FBC.

[4] Fourth Embodiment

The semiconductor memory device 1 according to a fourth embodiment has the same configuration as the first embodiment and finely controls the time and the kick amount of a kick operation. Hereinafter, the points of the semiconductor memory device 1 according to the fourth embodiment which differ from the first to third embodiments will be described.

[4-1] Setting of Kick Operation

Optimum settings of the kick operations described in the above embodiments differ between a case of suppressing the top skirt fail bit TFB and a case of suppressing the bottom skirt fail bit BFB. Furthermore, the suppression effect of the top skirt fail bit TFB and the suppression effect of the bottom skirt fail bit BFB also differ depending on the kick amount and the kick period. The semiconductor memory device 1 according to the fourth embodiment finely controls the time and the kick amount (voltage) of a kick operation, based on the transition amount of the read voltage, for example. Hereinafter, a specific example of a read operation in the case of suppressing top skirt fail bits TFB and a specific example of a read operation in the case of suppressing bottom skirt fail bits BFB will be described in that order.

(Case of Suppressing Top Skirt Fail Bits TFB)

Figure 22:
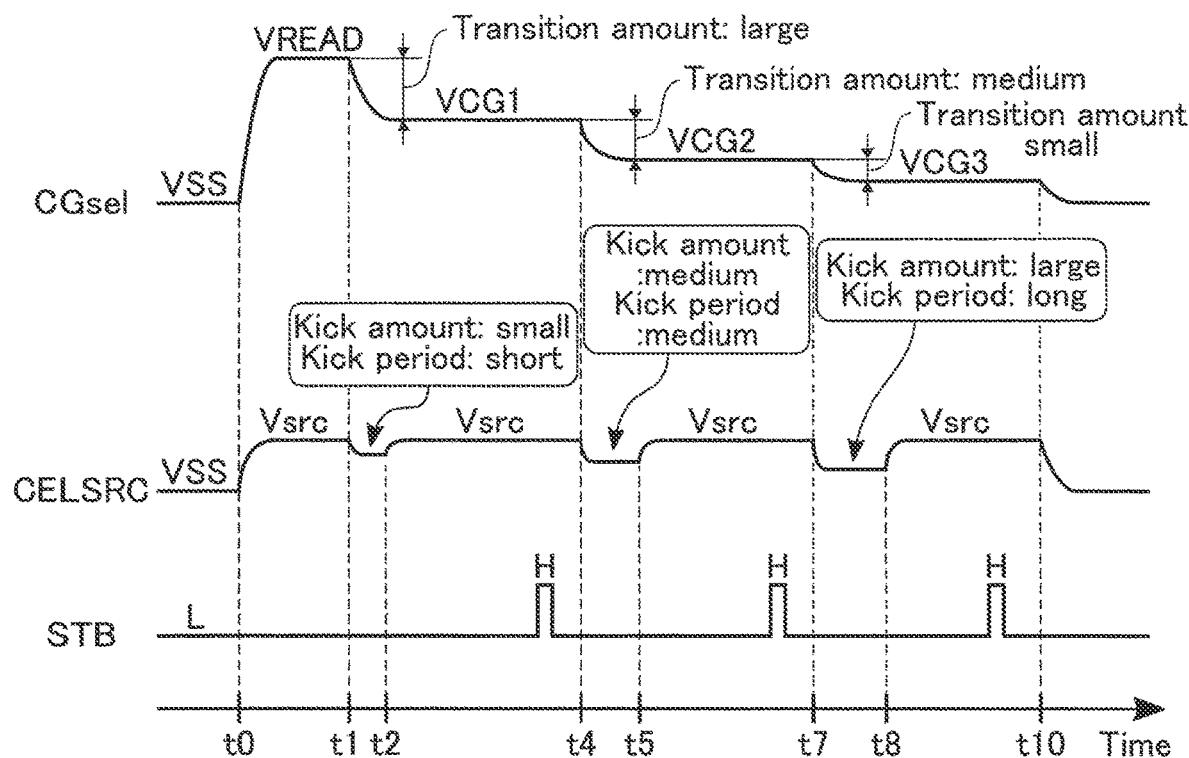
FIG. 22 is a timing chart illustrating an example of a read operation in a semiconductor memory device according to a fourth embodiment.

FIG. 22 is a timing chart illustrating an example of a read operation in the semiconductor memory device 1 according to the fourth embodiment, and further illustrates setting examples of kick operations (NEG) for suppressing the top skirts. The operations during a period time t0 to t10 in FIG. 22 respectively correspond to the operations during the period time t0 to t10 in FIG. 14 described in the first embodiment. VCG1, VCG2, and VCG3 are read voltages, respectively, where VCG1>VCG2>VCG3.

As illustrated in FIG. 22, the transition amount of voltage from VREAD to VCG1 is large (Transition: large), the transition amount of voltage from VCG1 to VCG2 is around a medium level (Transition: medium), and the transition amount of voltage from VCG2 to VCG3 is small (Transition: small). Between time t1 to time t2, a kick operation corresponding to the read voltage VCG1 is executed; between time t4 and time t5, a kick operation corresponding to the read voltage VCG2 is executed; and between time t7 and time t8, a kick operation corresponding to the read voltage VCG3 is executed.

In the kick operation for suppressing the top skirt, negative kick is used, for example. In the negative kick corresponding to the read voltage VCG1, the transition amount of read voltage is large, and the negative kick is thus set so that the kick amount is small and the kick period is short. In the negative kick corresponding to the read voltage VCG2, the transition amount of read voltage is around a medium level, and the negative kick is thus set so that the kick amount is about medium and the kick period is about medium in length. In the negative kick corresponding to the read voltage VCG3, the transition amount of read voltage is small, and the negative kick is thus set so that the kick amount is large and the kick period is long. In other words, the kick amount becomes larger in the order of VCG1, VCG2, and VCG3. The kick period corresponding to VCG1 (i.e., the time interval between time t1 and time t2) is shorter than the kick period corresponding to VCG2 (i.e., the time interval between time t4 and time t5). The kick period corresponding to VCG2 is shorter than the kick period corresponding to VCG3 (i.e., the time interval between time t7 and time t8).

In the present embodiment, it is assumed that as the transition amount of read voltage becomes smaller, the top skirt fail bit count TFBC becomes greater. Furthermore, in the negative kick in the present embodiment, it is assumed that as the kick amount becomes larger, the effect of suppressing the top skirt fail bits TFB becomes larger, and as the kick period becomes longer, the effect of suppressing the top skirt fail bits TFB becomes larger.

(Case of Suppressing Bottom Skirt Fail Bits BFB)

Figure 23:
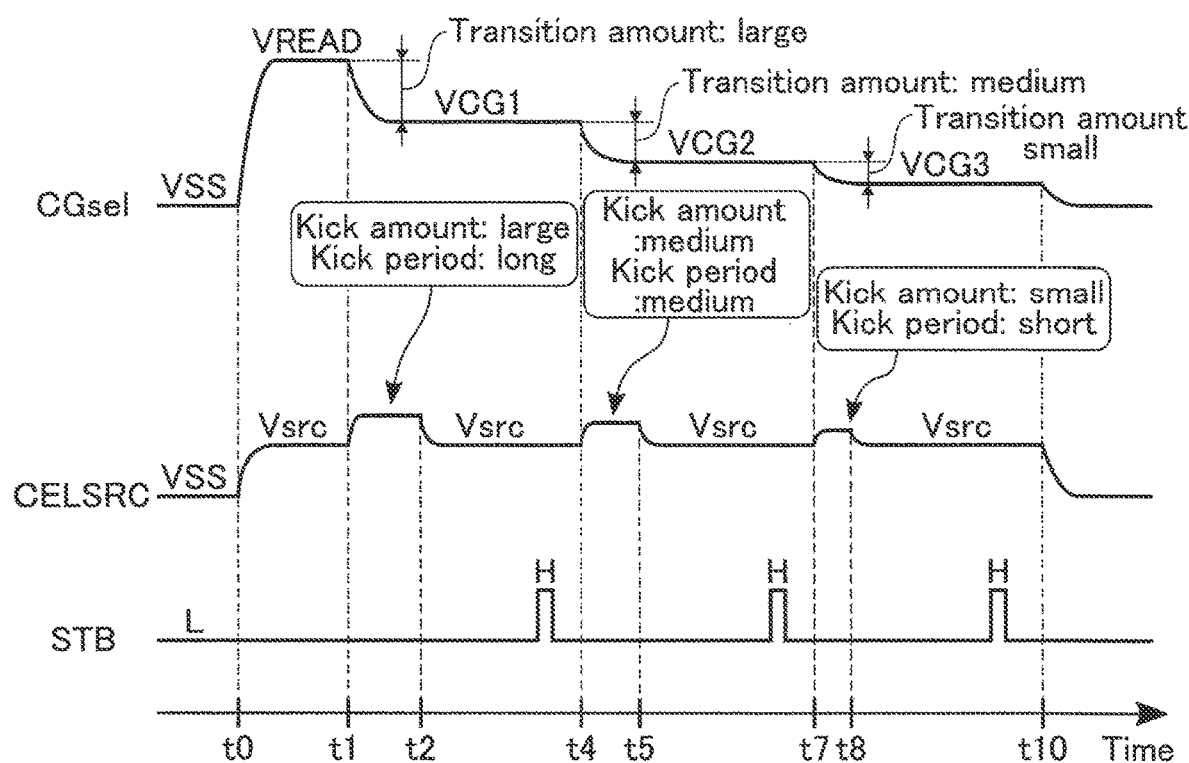
FIG. 23 is a timing chart illustrating an example of a read operation in the semiconductor memory device according to the fourth embodiment.

FIG. 23 is a timing chart illustrating an example of a read operation in the semiconductor memory device 1 according to the fourth embodiment, which further illustrates setting examples of kick operations (POS) for suppressing the bottom skirts. The operations during a period time t0 to time t10 in FIG. 23 respectively correspond to the operations during the period time t0 to time t10 in FIG. 14 described in the first embodiment. VCG1 to VCG3 are identical to those of FIG. 22.

As illustrated in FIG. 23, a kick operation corresponding to the read voltage VCG1 is executed in a period time t1 to time t2, a kick operation corresponding to the read voltage VCG2 is executed in a period time t4 to time t5, and a kick operation corresponding to the read voltage VCG3 is executed in a period time t7 to time t8.

In the kick operation for suppressing the bottom skirt, positive kick is used, for example. In the positive kick corresponding to the read voltage VCG1, the transition amount of read voltage is large, and the positive kick is thus set so that the kick amount is large and the kick period is long. In the positive kick corresponding to the read voltage VCG2, the transition amount of read voltage is around a medium level, and the positive kick is thus set so that the kick amount is about medium and the kick period is about medium in length. In the positive kick corresponding to the read voltage VCG3, the transition amount of read voltage is small, and the positive kick is thus set so that the kick amount is small and the kick period is short. In other words, the kick amount is decreased in the order of VCG1, VCG2, and VCG3. The kick period corresponding to VCG1 (i.e., the time interval between time t1 and time t2) is longer than the kick period corresponding to VCG2 (i.e., the time interval between time t4 and time t5). The kick period corresponding to VCG2 is longer than the kick period corresponding to VCG3 (i.e., the time interval between time t7 and time t8).

In the present embodiment, it is assumed that as the transition amount of read voltage become larger, the bottom skirt fail bit count BFBC becomes greater. In the positive kick in the present embodiment, it is assumed that as the kick amount becomes larger, the effect of suppressing bottom skirt fail bits BFB becomes larger, and as the kick period becomes longer, the effect of suppressing bottom skirt fail bits BFB becomes larger.

[4-2] Effect of Fourth Embodiment

As described above, the semiconductor memory device 1 according to the fourth embodiment can finely control a kick operation in accordance with the dominant kind of fail bits. As a result, the semiconductor memory device 1 according to the fourth embodiment can suppress the fail bit count FBC, while suppressing the influence of the RC delay of word line WL, similarly to or more effectively than the first embodiment. That is, the semiconductor memory device 1 according to the fourth embodiment can speed up a read operation and improve the reliability of read data similarly to or more effectively than the first embodiment.

Although the fourth embodiment is illustrated as an example of the case of changing both the kick amount and the kick period, the kick amount and the kick period may be changed individually. For example, the kick period may be changed in a state where the kick amount is fixed, and the kick amount may be changed in a state where the kick period is fixed. In this way, in the semiconductor memory device 1 according to the fourth embodiment, the kick amount and the kick period in a kick operation can be suitably changed.

[5] Other Modification

According to one embodiment, a semiconductor memory device includes a bit line, a source line, a memory cell, a word line, a controller. The memory cell is connected between the bit line and the source line. The word line is connected to a gate of the memory cell. The controller is configured to execute a read operation. In the read operation, the controller is configured to: apply a first read voltage and a second read voltage different from the first read voltage to the word line, read data at each of first time and second time, the first time being time at which the first read voltage is applied to the word line, the second time being time at which the second read voltage is applied to the word line, apply the first voltage to the source line at each of the first time and the second time, apply a second voltage higher than the first voltage to the source line during the application of the first read voltage to the word line and before the first time, and apply a third voltage lower than the first voltage to the source line during the application of the second read voltage to the word line and before the second time. With this configuration, it is possible to speed up the reading operation of the semiconductor memory device.

The models of the kick operations described in the above embodiments are presented by way of example only. For example, it is assumed that the effect of the kick operation to bit line BL is also changed depending on the ON state or OFF state of a memory cell applied with a read voltage in read processing in which the kick operation is executed. For example, when the threshold voltage of a memory cell to which a read voltage has been applied is larger than the read voltage, the voltage of the bit line BL needs to be at the "H" level when the sequencer 13 reflects, in the node SEN, the voltage of the bit line BL. For this reason, when a memory cell to which a read voltage has been applied comes into the OFF state, it is preferable that the voltage of the bit line BL be maintained in a high-voltage state.

That is, in each read processing, in a bit line BL coupled to a memory cell which comes into the OFF state (hereinafter, referred to as an "OFF-cell"), the effect due to over-discharge of the bit line BL is large, causing a read error. Therefore, it is preferable that a kick operation be executed for a bit line BL coupled to a memory cell which will definitely come into the OFF state.

In contrast, when the threshold voltage of a memory cell to which a read voltage has been applied is equal to or lower than the read voltage, the voltage of the bit line BL needs to be at the "L" level when the voltage of the bit line BL is reflected in the node SEN. For this reason, when a memory cell to which a read voltage has been applied is in the ON state, it is preferable that the voltage of the bit line BL be maintained in a low state.

Therefore, in each reading processing, in a bit line BL coupled to a memory cell which comes into the ON state (hereinafter, referred to as an "ON-cell"), the influence of the over-discharge of the bit line is small. For this reason, it is preferable that a kick operation be omitted for a bit line BL coupled to a memory cell which will definitely come into the ON state.

Also, in each read processing, when a kick operation is executed for a bit line BL coupled to an ON-cell, the amount of change in voltage of the bit line BL is increased. In this case, it can be assumed that the voltage of the bit line BL coupled to the ON-cell and the voltage of an adjacent bit line BL are depressed by capacity coupling. For example, when a bit line BL coupled to an ON-cell is adjacent to a bit line BL coupled to an OFF-cell, the voltage of the bit line BL coupled to the OFF-cell is depressed, possibly causing a read error in the bit line BL coupled to the OFF-cell.

In the semiconductor memory device 1 in the embodiments, the settings of kick operations may be changed depending on whether ON-cells or OFF-cells are dominant in number. For example, the semiconductor memory device 1 may selectively omit a kick operation for a bit line BL for which it is possible to determine in advance that the bit line BL is in the ON state. In this case, the semiconductor memory device 1 can reduce read errors caused by the implementation of a kick operation for a bit line BL coupled to an ON cell. Furthermore, the kick operation of the bit line BL is properly implemented, so that the time required for stabilizing the voltage of the bit line BL is shortened and the read operation can be speed up.

In the above embodiments, the kick amounts in the respective kick operations for the word line WL, source line CELSRC, and bit line BL are omitted; however, the kick amounts may be suitably set for each interconnect to be subjected to a kick operation. In the kick operations of the bit line BL, a case is illustrated as an example where kick operations in the same direction are used for the control signal BLX and the control signal BLC; however, the setting of the kick operation for the control signal BLX and the setting of the kick operation for the control signal BLC may differ.

In the above embodiments, a case is illustrated as an example in which the timing of the start or end of a kick operation is the same between the control signal BLC and the source line CELSRC; however, the setting of the timing is not limited thereto. For example, it is possible to obtain a different effect by shifting the timing at which a kick operation of the control signal BLC ends from the timing at which a kick operation of the source line CELSRC ends.

Figure 24:
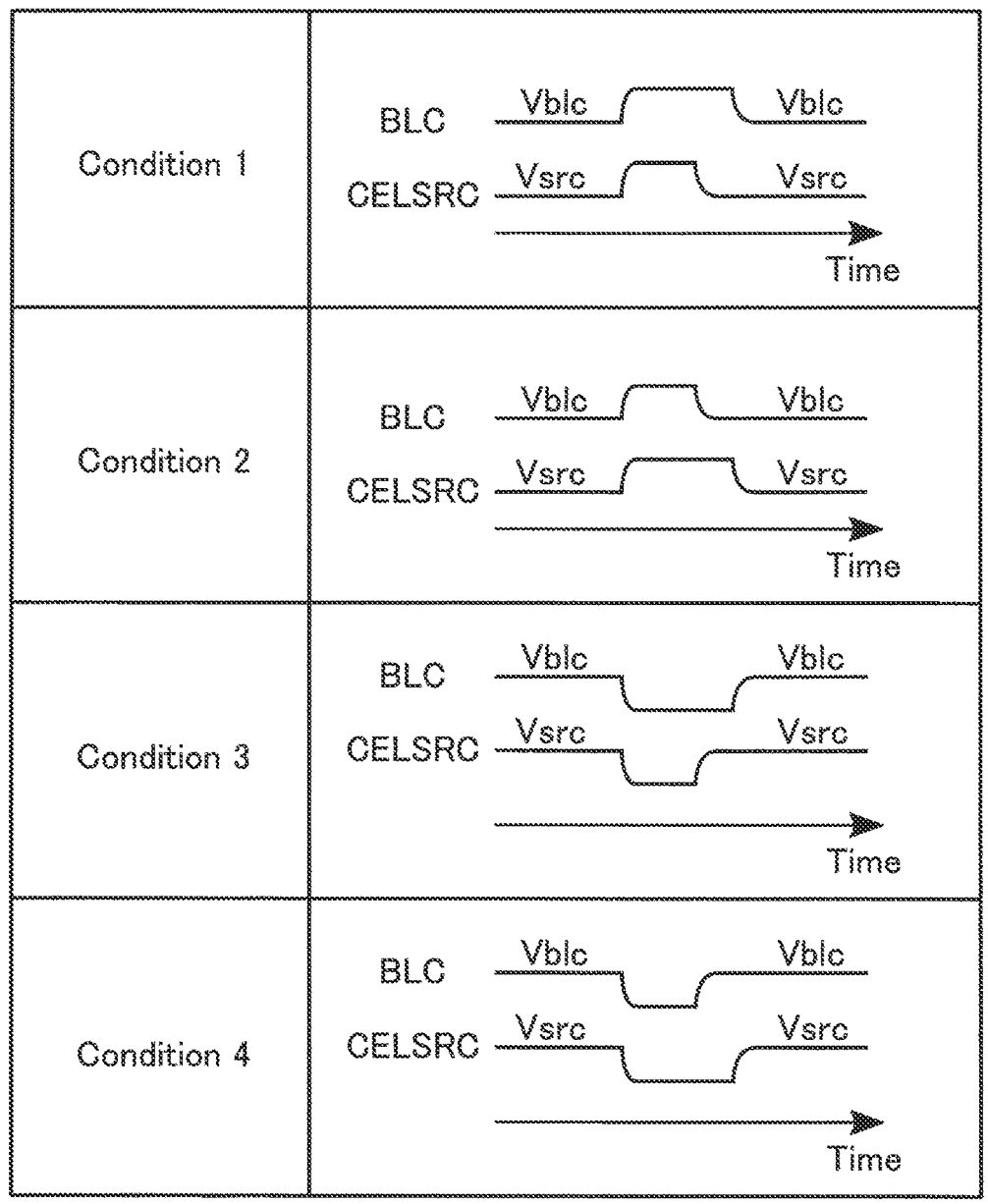
FIG. 24 is a timing chart illustrating an example of the operational timing of BLC and the operational timing of CELSRC in kick operations in a semiconductor memory device according to a first modification of the first embodiment.

FIG. 24 illustrates an example of the operational timing of the control signal BLC and the operational timing of the source line CELSRC in the kick operation of the semiconductor memory device 1 according to a first modification of the first embodiment. As illustrated in FIG. 24, the following cases (conditions) can be considered for the end timing of a kick operation, for example: a case where positive kick is employed, and the kick operation of the source line CELSRC ends first (Condition 1); a case where positive kick is employed, and the kick operation of the control signal BLC ends first (Condition 2); a case where negative kick is employed, and the kick operation of the source line CELSRC ends first (Condition 3); and a case where negative kick is employed, and the kick operation of the control signal BLC ends first (Condition 4).

Under the condition 1, when the voltage of the source line CELSRC is dropped, the gate-source voltage (Vgs) of the memory cell transistor MT is increased, causing a memory cell(s) whose state transfers from the OFF state to the ON state. For this reason, bit lines BL in OFF-cells are likely to be changed into ON-cells by coupling of the adjacent bit lines BL. In contrast, the semiconductor memory device 1 can reduce data changes from the OFF-state to the ON-state caused by the source line CELSRC by dropping the voltage of the control signal BLC subsequent to the drop of voltage of the source line CELSRC.

Under the condition 2, the kick operation of the control signal BLC is prone to generate noise upon a result of reading, because the kick operation changes the voltage of a node nearer to the sense amplifier unit SAU than the source line CELSRC. Therefore, the semiconductor memory device 1 can suppress the influence of noise and prevent data changes caused by a kick operation of the control signal BLC by dropping the kick voltage of the control signal BLC prior to that in the source line CELSRC.

Under the condition 3, when the voltage of the source line CELSRC is increased, the gate-source voltage (Vgs) of the memory transistor MT decreases, resulting in a memory cell(s) whose state transfers from the ON state to the OFF state. For this reason, bit lines BL in ON-cells are likely to be changed into OFF-cells by the coupling of the adjacent bit lines BL. In contrast, the semiconductor memory device 1 can reduce data changes from the ON-state to the OFF-state caused by the source line CELSRC by raising the voltage of the control signal BLC subsequent to the drop of voltage of the source line CELSRC.

Under the condition 4, the kick operation of the control signal BLC is prone to generate noise upon a result of reading, because the kick operation changes the voltage of a node nearer to the sense amplifier unit SAU than the source line CELSRC. Therefore, the semiconductor memory device 1 can suppress the influence of noise and reduce data changes caused by a kick operation of the control signal BLC by increasing the kick voltage of the control signal BLC earlier than in the source line CELSRC.

As described above, the settings of the kick operations under the conditions 1 to 4 produce different advantageous effects and side effects. The semiconductor 1 according to the above-described embodiment can effectively suppress desired fail bits and speed up a read operation by properly using the conditions 1 to 4 depending on the case. The settings shown in FIG. 24 can be used for the second to fourth embodiments, making it possible to obtain the same advantageous effects as those in the first modification of the first embodiment.

FIG. 25 illustrates an example of the settings of kick operations in the read operation of the semiconductor memory device 1 according to a second modification of the first embodiment. As illustrated in FIG. 25, nine kinds of combinations (Settings 1 to 9) can be considered for the setting of a kick operation of the control signal BLC and the setting of a kick operation of the source line CELSRC.

Setting 1 is a combination in which the negative kick of the control signal BLC and negative kick of the source line CELSRC are executed. Setting 2 is a combination in which the negative kick of the control signal BLC is executed, and the kick operation of the source line CELSRC is omitted. Setting 3 is a combination in which the negative kick of the control signal BLC and positive kick of the source line CELSRC are executed.

Setting 4 is a combination in which the kick operation of the control signal BLC is omitted, and the negative kick of the source line CELSRC is executed. Setting 5 is a combination in which both the kick operation of the control signal BLC and the kick operation of the source line CELSRC are omitted. Setting 6 is a combination in which the kick operation of the control signal BLC is omitted, and the positive kick of the source line CELSRC is executed.

Setting 7 is a combination in which the positive kick of the control signal BLC and the negative kick of the source line CELSRC are executed. Setting 8 is a combination in which the positive kick of the control signal BLC is executed, and the kick operation of the source line CELSRC is omitted. Setting 9 is a combination in which the positive kick of the control signal BLC and the positive kick of the source line CELSRC are executed.

The combination of the kick operation of the control signal BLC and the kick operation of the source line CELSRC can be suitably changed as described above. In addition, the fourth embodiment or the first modification of the first embodiment can also be combined with the first modification of the first embodiment.

For example, the effect brought about by the kick operation of the control signal BLC is larger than that brought about by the kick operation of the source line CELSRC. In contrast, the side effect caused by the kick operation of the control signal BLC is larger than that caused by the kick operation of the source line CELSRC. For this reason, for example, when particular fail bits need to be greatly reduced, it is effective for the semiconductor memory device 1 to execute both the kick operation of the control signal BLC and the kick operation of the source line CELSRC. In addition, it is also effective for the semiconductor memory device 1 to selectively execute the kick operation of the control signal BLC and the kick operation of the source line CELSRC in accordance with the degree of necessity of the effect of suppressing fail bits.

As described above, in the read operation, it is preferable to suitably combine the kick operation of the control signal BLC with the kick operation of the source line CELSRC, and/or suitably change the kick amount and kick period of each kick operation.

Figure 26:
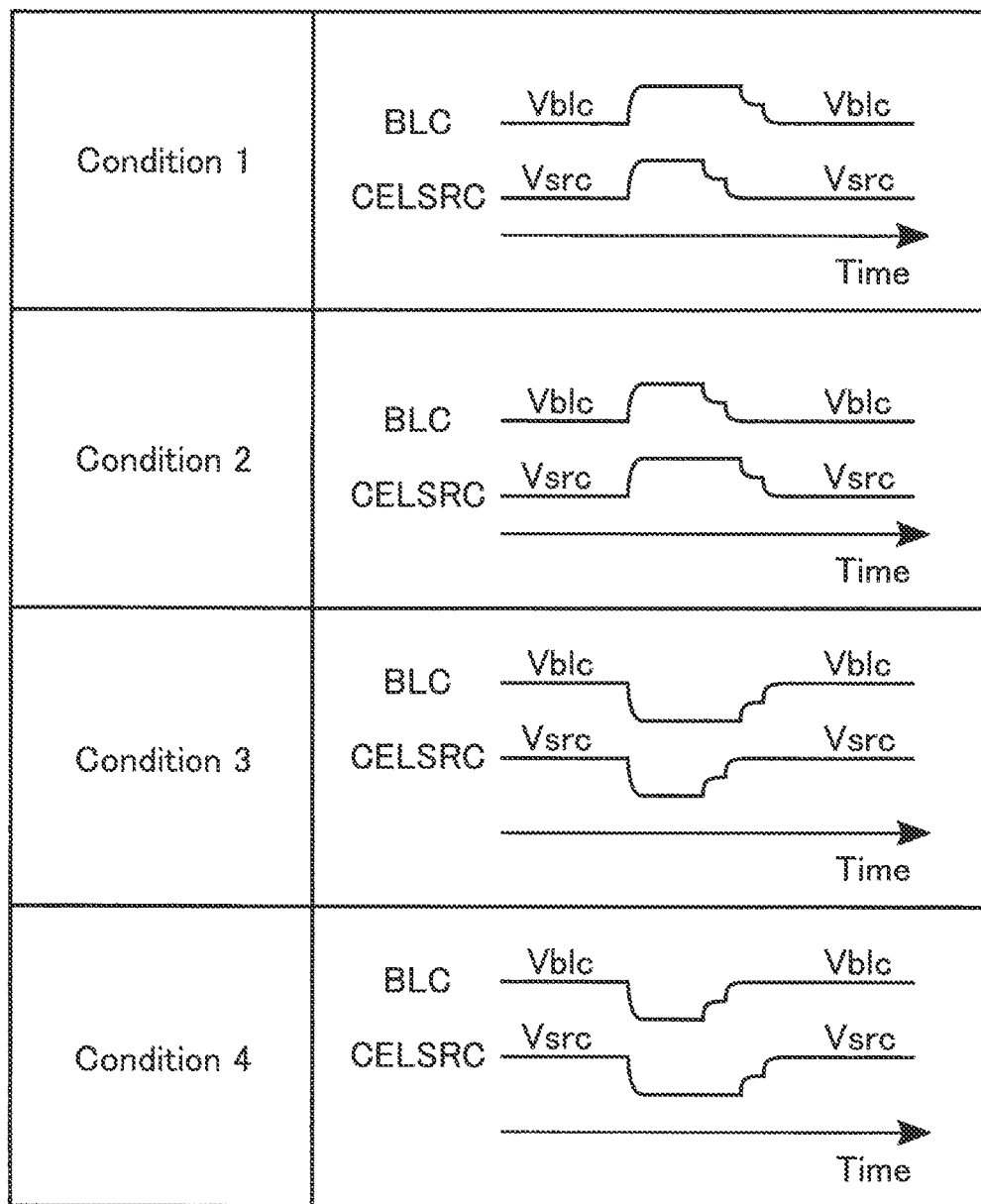
FIG. 26 is a timing chart illustrating an example of the operational timing of BLC and the operational timing of CELSRC in kick operations in a semiconductor memory device according to a third modification of the first embodiment.

FIG. 26 illustrates an example of operational timing of the control signal BLC and the source line CELSRC in the kick operation of a semiconductor memory device 1 according to a third modification of the first embodiment. As illustrated in FIG. 26, the conditions 1 to 4 in the third modification of the first embodiment are respectively similar to the conditions 1 to 4 in the first modification of the first embodiment. The third modification of the first embodiment differs from the first modification in the operation when the voltage returns from a kick voltage to the original voltage.

Specifically, in the third modification of the first embodiment, under each of the conditions 1 and 2, the voltage of the control signal BLC drops at two stages when dropping from the kick voltage to Vblc. Similarly, the voltage of the source line CELSRC drops at two stages when dropping from the kick voltage to Vsrc. Under each of the conditions 3 and 4, the voltage of the control signal BLC is increased at two stages when the voltage increases from the kick voltage to Vblc. Similarly, the voltage of the source line CELSRC is increased at two stages when increasing from the kick voltage to Vsrc.

In this way, when the voltage transfers from a kick voltage to the original voltage, the voltage may be applied in a plurality of separated stages. In other words, when the sequencer 13 causes the voltage of the control signal BLC or the source line CELSRC to transfer from a kick voltage to the original voltage, the sequencer 13 changes the voltage in a staircase manner. With this configuration, it is possible, in each kick operation of the control signal BLC and the source line CELSRC, to reduce the occurrence of noise attributable to the kick operation.

In the third modification of the first embodiment, an example of a case is illustrated in which a kick voltage is returned to the original voltage in a staircase manner; however, the method of returning the kick voltage to the original voltage is not limited thereto. Similar advantageous effects to those of the third modification of the first embodiment can also be realized by setting a longer time for the return of a kick voltage to the original voltage. In the third modification of the first embodiment, a case is illustrated as an example in which the voltage of the control signal BLC and the voltage of the source line CELSRC are transferred in the same manner; however, the control method of the transfer of the voltages is not limited thereto. The control method used when returning a kick voltage to the original voltage may differ between the control signal BLC and the source line CELSRC. Furthermore, the time when returning a kick voltage to the original voltage may also differ between the control signal BLC and the source line CELSRC.

The read operations described in the above-described embodiments can also be used for verification read (verify read) operations in write operations. Also in the case where the above-described embodiments are used for the verification read (verify read) operations, the semiconductor memory device 1 can obtain the same advantageous effects as in the above-described embodiments.

In the above-described embodiments, the timing at which a kick operation is started may be set in a discretional manner. It suffices that the timing at which the kick operation starts is included within at least a period encompassing the start of application of a corresponding read voltage and voltage stabilization to the read voltage.

In the above-described embodiments, a case is illustrated as an example whereby when a read voltage transfers from a higher voltage to a lower voltage, the kick operation for a selected signal line CGsel is omitted; however, the configuration of the above-described embodiment is not limited thereto. For example, when a read voltage is transferred from a higher voltage to a lower voltage, the kick operation for the selected signal line CGsel may be executed. In this case, the kick amount in the kick operation may be set to a negative value, for example. Furthermore, a case is described where the kick amount used in the kick operation for the selected signal line CGsel is constant, the kick amount of the selected signal line CGsel is not limited thereto. For example, the kick amount corresponding to the selected signal line CGsel may be changed on a read voltage basis.

The timing charts used in the descriptions of the read operations in the above-described embodiments are presented by way of example only. For example, at each time, the timing of controlling the voltage for a signal and the timing of controlling the voltage of an interconnect, in each time, may be shifted from each other. In the read operation, it suffices that at least the anteroposterior relationship of the operation at each time is not reversed. In the read operation, the operation for removing residual electrons in the channel may be omitted.

In the above-described embodiment, a case is illustrated as an example, where QLC (Quadruple-Level Cell) is used as a data storing method; however, the method is not limited thereto. For example, also in the case where a memory cell transistor MT stores data of 2 bits, 3 bits, or 5 bits or more, the semiconductor memory device 1 can execute the read operations described in the above-described embodiments and obtain similar advantageous effects as those in the above-described embodiments. The above-described embodiments can be implemented even when any data allocation is used for a memory cell transistor.

In the above-described embodiments, a case is illustrated as an example of the structure where a voltage is applied from one side of a memory cell array in the X direction to stacked interconnects, such as word lines WL; however, the structure is not limited thereto. For example, the memory cell array 10 may have a structure allowing application of a voltage from both sides in the X-direction to a word line WL, etc. Even in such a case, the influence of the RC delay occurs, for example, at the center portion of the word line WL. Therefore, by applying any of the above-described embodiments, similar advantageous effects can be obtained.

In the above-described embodiments, a case is illustrated as an example where the voltage of the selected word line WLsel is identical to the voltage of the selected signal line CGsel; however, the voltages are not limited thereto. The voltage of the selected word line WLsel may differ from that of the selected signal line CGsel, and it suffices that the voltage of the selected word line WLsel is changed based on the change of the selected signal line CGsel.

In the above-described embodiments, the memory pillars MP may have a structure where a plurality of pillars are coupled in the Z direction. For example, the memory pillars MP may have a structure where a pillar penetrating through the conductive layer 35 (select gate line SGD) and a pillar penetrating through a plurality of conductive layers 34 (word lines WL) is coupled. Furthermore, the memory pillars MP may have a structure where a plurality of pillars each penetrating through a plurality of the conductive layers 34 are coupled in the Z direction.

In the above-described embodiments, a case is illustrated as an example where the semiconductor memory device 1 has a structure in which the memory cell array 10 is formed on a semiconductor substrate; however, the structure of the semiconductor memory device 1 is not limited thereto. For example, the semiconductor memory device 1 may have a structure in which a circuit of the sense amplifier module 16, etc. is disposed under the memory cell array 10. Furthermore, the above-described embodiments may be used for a planar NAND flash memory in which memory cell transistors MT are arranged in a two-dimensional manner.

In the present specification, the "period in which the controller applies a read voltage" corresponds to, for example, in FIG. 14, the period from time t1 to time t4 corresponding to the read voltage NR, or a period from time t4 to time t7 corresponding to the read voltage HR, etc. That is, in the present specification, a period during which each read voltage is applied may be expressed as a period including the time point at which application of the read voltage is started and the period in which the kick operation is executed.

In the present specification, the voltage of "H" level is a voltage at which an N-type MOS transistor to which said voltage is applied to its gate comes into the ON state, and a P-type MOS transistor to which said voltage is applied to its gate comes into the OFF state. The voltage of "L" level is a voltage at which an N-type MOS transistor in which said voltage is applied to its gate comes into the OFF state, and a P-type MOS transistor to which said voltage is applied to its gate enters the ON state.

In the present specification, "coupled/connected" means that a subject is electrically connected to an object, not excluding an interpolation of another element or other elements between them. Furthermore, in the present specification, the term "OFF state" means that a voltage lower than the threshold voltage of a corresponding transistor is applied to the gate of the corresponding transistor, not excluding the case where fine electric current akin to, for example, a leak current of a transistor is flowing through the channel.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A device comprising:
a plurality of memory cells, each of the memory cells having a first end, a second end, and a gate, and each of the memory cells being configured to store data of n bits by being set to have one of m threshold voltages, where n is an integer equal to or larger than 2, and m is an integer of n to the power of 2;

a plurality of bit lines, each of the bit lines being connected to the first end of a respective one of the memory cells;

a source line commonly connected to the second ends of the memory cells;

a word line commonly connected to the gates of the memory cells; and a controller configured to perform a read operation to read one of the n bits of the data stored by the memory cells by applying voltages to the bit lines, the source line, and the word line, wherein, in the read operation:

during a first time period, (i) a first voltage is applied to the word line, and (ii) a voltage difference between the bit lines and the source line is brought into a first voltage difference, and during a second time period after the first time period, (i) a second voltage lower than the first voltage is applied to the word line, and (ii) the voltage difference between the bit lines and the source line is brought into a second voltage difference different from the first voltage difference.

2. The device of claim 1, wherein, during a third time period after the second time period, (i) a third voltage is applied to the word line, and (ii) the voltage difference between the bit lines and the source line is brought into a third voltage difference different from the second voltage difference.

3. The device of claim 1, wherein, during a fourth time period before the first time period, (i) a fourth voltage higher than the first voltage is applied to the word line, and (ii) the voltage difference between the bit lines and the source line is brought into a fourth voltage difference different from the first voltage difference.

4. The device of claim 3, further comprising:

a plurality of sense amplifiers, each of the sense amplifiers being connected to a respective one of the bit lines, wherein each of the sense amplifiers includes:

a first transistor connected between a power supply node and a corresponding one of the bit lines, a second transistor connected between the first transistor and a sense node, a third transistor having a gate connected to the sense node, and a fourth transistor connected in series with the third transistor, wherein, during the first time period:

a fifth voltage is applied to a gate of the first transistor, and a sixth voltage is applied to the source line, wherein, during the second time period:

a seventh voltage is applied to the gate of the first transistor, and an eighth voltage is applied to the source line, and wherein, during the third time period:

a ninth voltage is applied to the gate of the first transistor, and a tenth voltage is applied to the source line.

5. The device of claim 4, wherein the fifth voltage and the seventh voltage are the same, and the eighth voltage and the tenth voltage are the same.

6. The device of claim 4, wherein:

during the first time period:

a positive kick voltage is applied to the gate of the first transistor as the fifth voltage, and a positive kick voltage is applied to the source line as the sixth voltage, and during the third time period:

the negative kick voltage is applied to the gate of the first transistor as the ninth voltage, and the negative kick voltage is applied to the source like as the tenth voltage.

7. The device of claim 1, wherein:

during the first time period, the voltages applied to the bit lines and the source line are increased at the same time, and during the third time period, the voltages applied to the bit lines and the source line are decreased at the same time.

8. The device of claim 7, wherein:

during the first time period, the voltage applied to the source line is decreased after the voltage applied to the bit lines is decreased, and during the third time period, the voltage applied to the source line is increased after the voltage applied to the bit lines is increased.

9. The device of claim 7, wherein:

during the first time period, the voltage applied to the bit lines is decreased after the voltage applied to the source line is decreased, and during the third time period, the voltage applied to the bit lines is increased after the voltage applied to the source line is increased.

10. The device of claim 7, wherein:

during the first time period, the voltage applied to the source line is decreased at least in two steps, and the voltage applied to the bit lines is decreased at least in two steps, and during the third time period, the voltage applied to the source line is increased at least in two steps, and the voltage applied to the bit lines is increased at least in two steps.

* * * * *